(12) United States Patent
Hirata et al.

(10) Patent No.: US 8,969,714 B2
(45) Date of Patent: Mar. 3, 2015

(54) SOLAR CELL MODULE AND METHOD OF MANUFACTURING SOLAR CELL MODULE

(75) Inventors: Hiroaki Hirata, Higashiomi (JP);
Hiroshi Ueda, Omihachiman (JP);
Kyouichi Ibaraki, Omihachiman (JP);
Ken-ichiro Sumida, Omihachiman (JP);
Noriyasu Kawakita, Hikone (JP);
Takeshi Kyouda, Higashiomi (JP);
Ryota Teshima, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 204 days.

(21) Appl. No.: 13/817,119

(22) PCT Filed: Sep. 29, 2011

(86) PCT No.: PCT/JP2011/072472
§ 371 (c)(1),
(2), (4) Date: Feb. 14, 2013

(87) PCT Pub. No.: WO2012/043770
PCT Pub. Date: Apr. 5, 2012

(65) Prior Publication Data
US 2013/0139871 A1 Jun. 6, 2013

(30) Foreign Application Priority Data

Sep. 29, 2010 (JP) .................... 2010-218688
Nov. 5, 2010 (JP) .................... 2010-248327
Dec. 28, 2010 (JP) .................... 2010-291752

(51) Int. Cl.
*H01L 31/0216* (2014.01)
*H01L 31/042* (2014.01)
(Continued)

(52) U.S. Cl.
CPC ............ *H01L 31/0504* (2013.01); *H01L 31/18* (2013.01); *H01L 31/022425* (2013.01);
(Continued)

(58) Field of Classification Search
USPC .................... 136/244, 259, 251, 256
See application file for complete search history.

(56) References Cited

U.S. PATENT DOCUMENTS

2002/0139411 A1 10/2002 Hiraishi et al.
2008/0223429 A1* 9/2008 Everett et al. .................. 136/244

FOREIGN PATENT DOCUMENTS

JP 2002-299666 A 10/2002
JP 2003-97000 A 4/2003
JP 2005-236017 A 9/2005

OTHER PUBLICATIONS

International Search Report issued by Japanese Patent Office for International Application No. PCT/JP2011/072472.
(Continued)

*Primary Examiner* — Jayne Mershon
(74) *Attorney, Agent, or Firm* — Procopio, Cory, Hargreaves & Savitch LLP

(57) ABSTRACT

The solar cell module comprises: a string including solar cell elements, each including a first main surface being rectangular in shape and an electrode extending along a longitudinal direction on the first main surface, and an interconnection connecting the solar cell elements adjacent to each other along the longitudinal direction; a light-transmitting member located to cover the string; and a sealing material located between the string and the light-transmitting member. Each of solar cell elements includes a silicon substrate with the first and second main surface, and a first and second side surfaces each connecting the first and second main surface, the second side surface being located on the back side of the first side surface. The first and second side surfaces are arranged along the longitudinal direction, where silicon is exposed on the first side surface and the second side surface is covered with an insulating layer.

19 Claims, 21 Drawing Sheets

(51) Int. Cl.
*H01L 31/05* (2014.01)
*H01L 31/18* (2006.01)
*H01L 31/0224* (2006.01)
*H01L 31/048* (2014.01)

(52) U.S. Cl.
CPC .. *H01L31/022441* (2013.01); *H01L 31/02245* (2013.01); *H01L 31/048* (2013.01); *H01L 31/0516* (2013.01); *Y02E 10/50* (2013.01)

USPC .......................................... 136/256; 136/251

(56) References Cited

OTHER PUBLICATIONS

International Preliminary Report on Patentability issued for Internationa Application No. PCT/JP2011/072472.

* cited by examiner

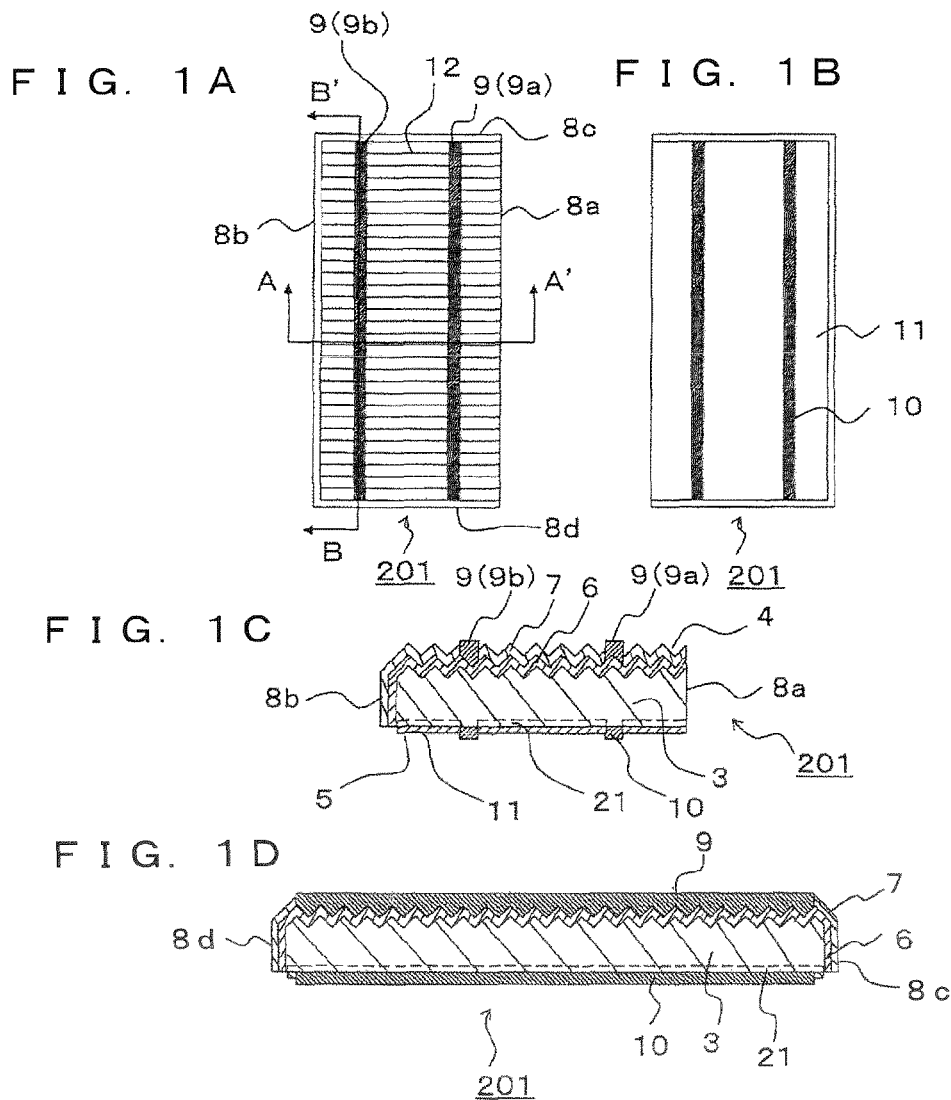

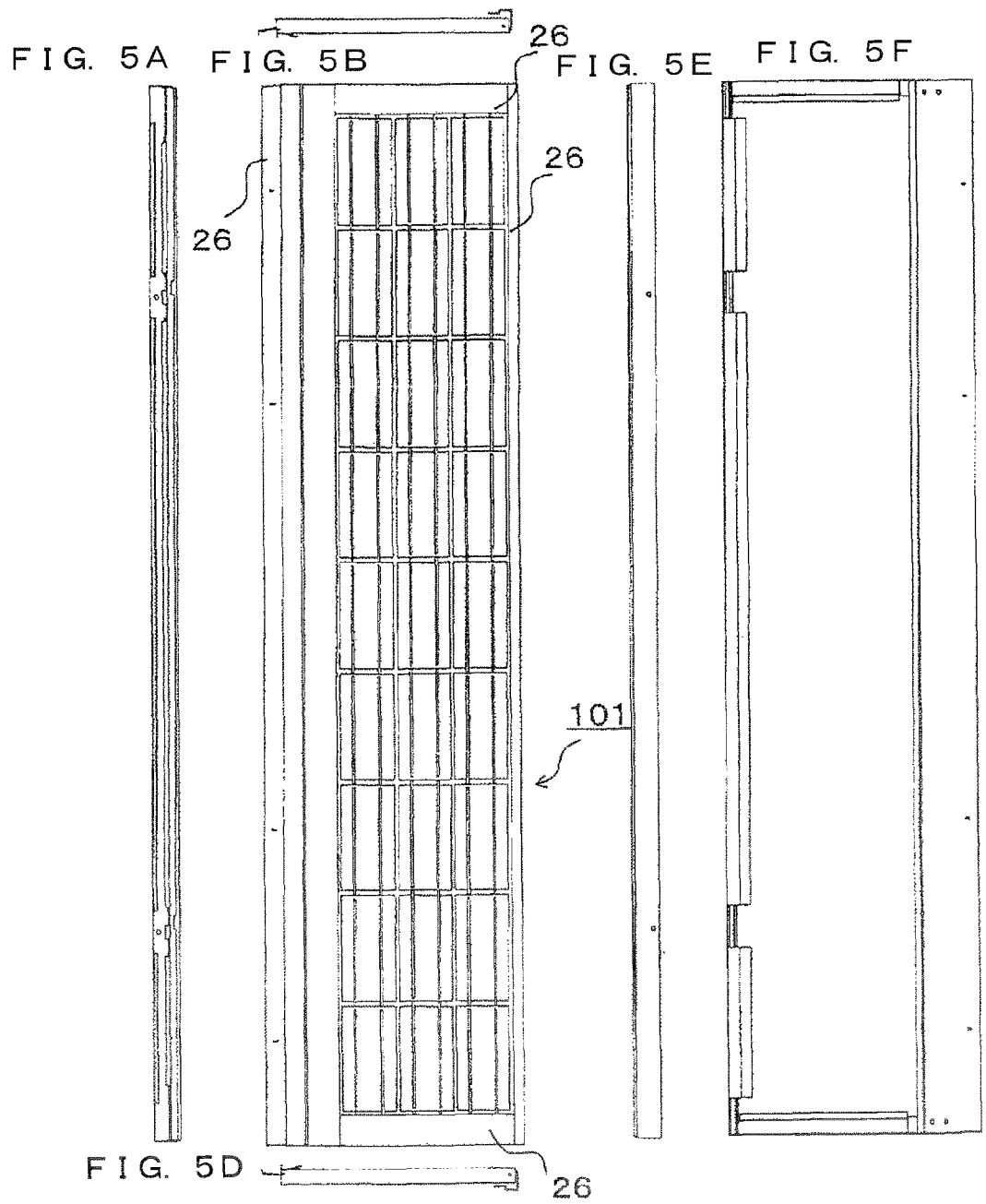

FIG. 8A
FIG. 8B
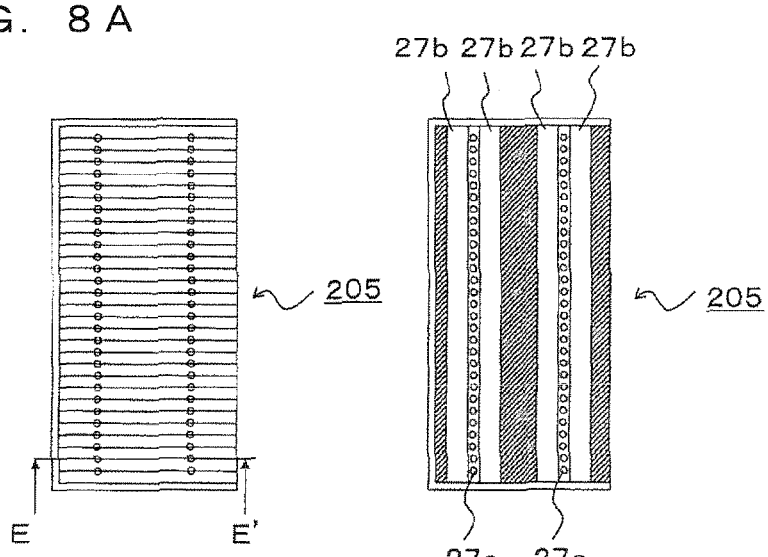
FIG. 8C
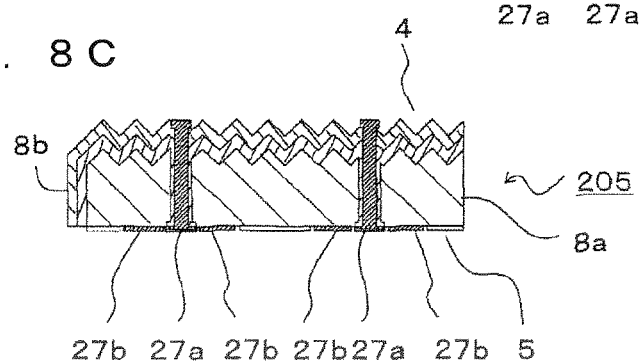

F I G. 1 1
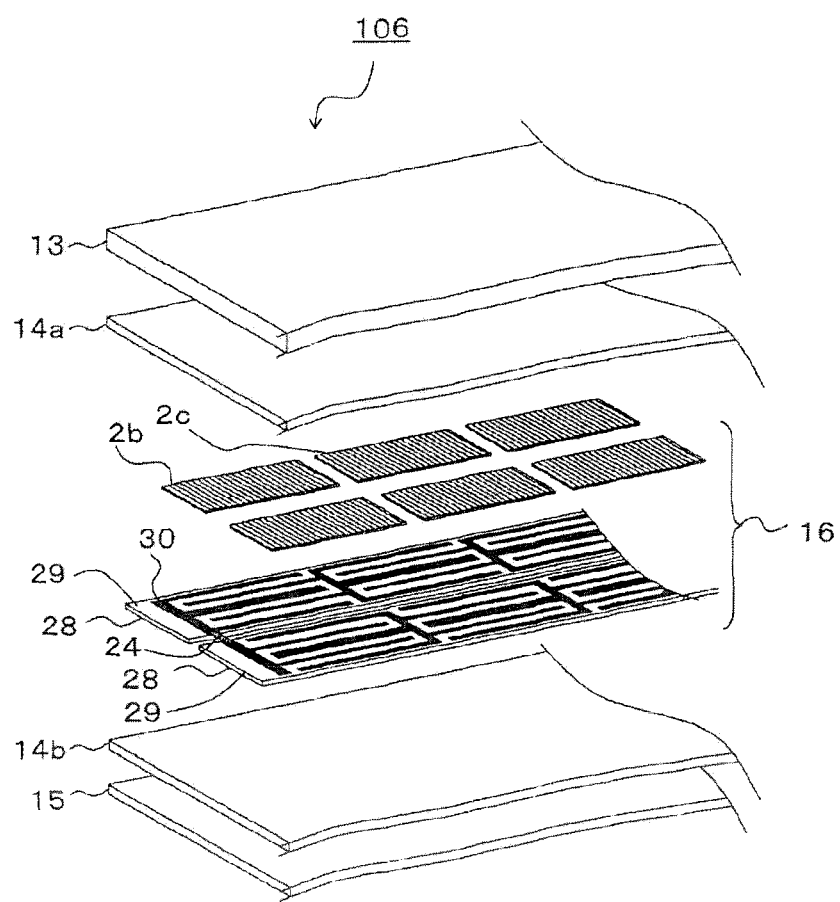

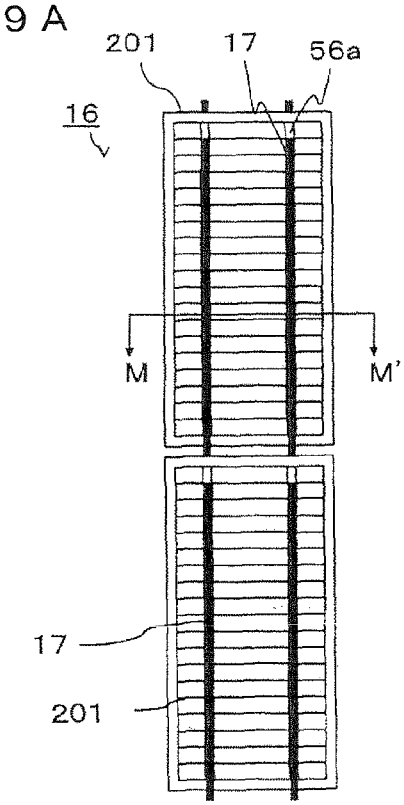
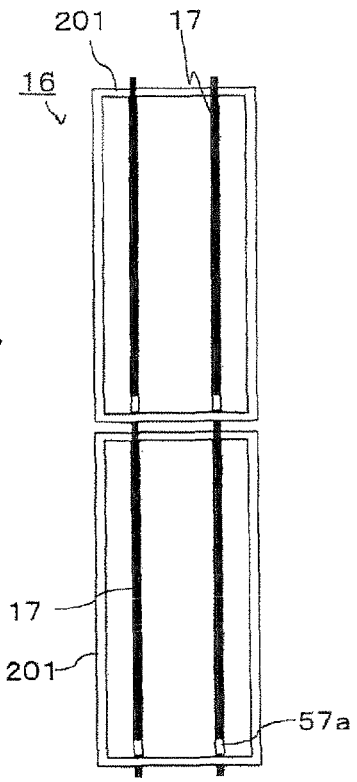
FIG. 19A  FIG. 19B
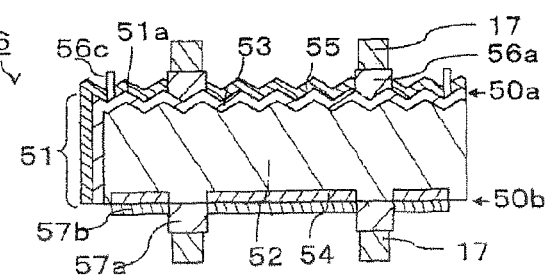
FIG. 19C
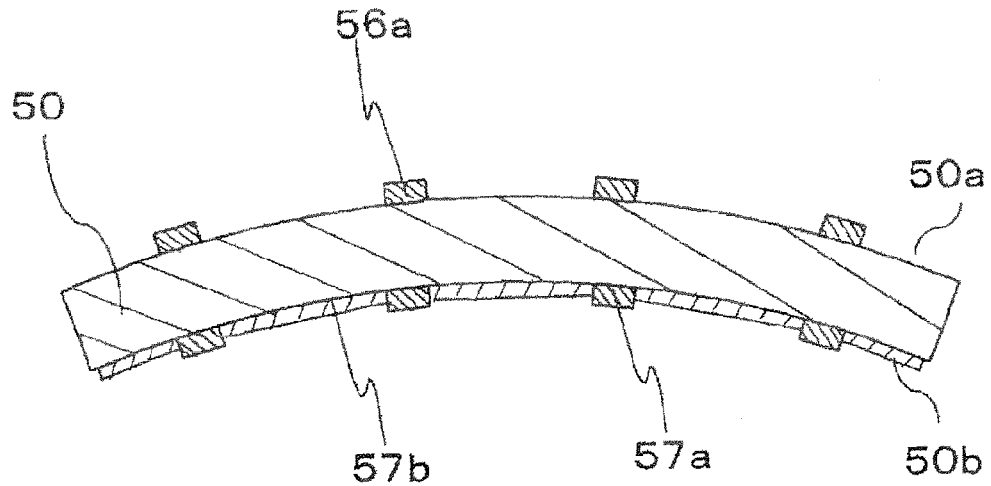
FIG. 20

F I G. 2 2
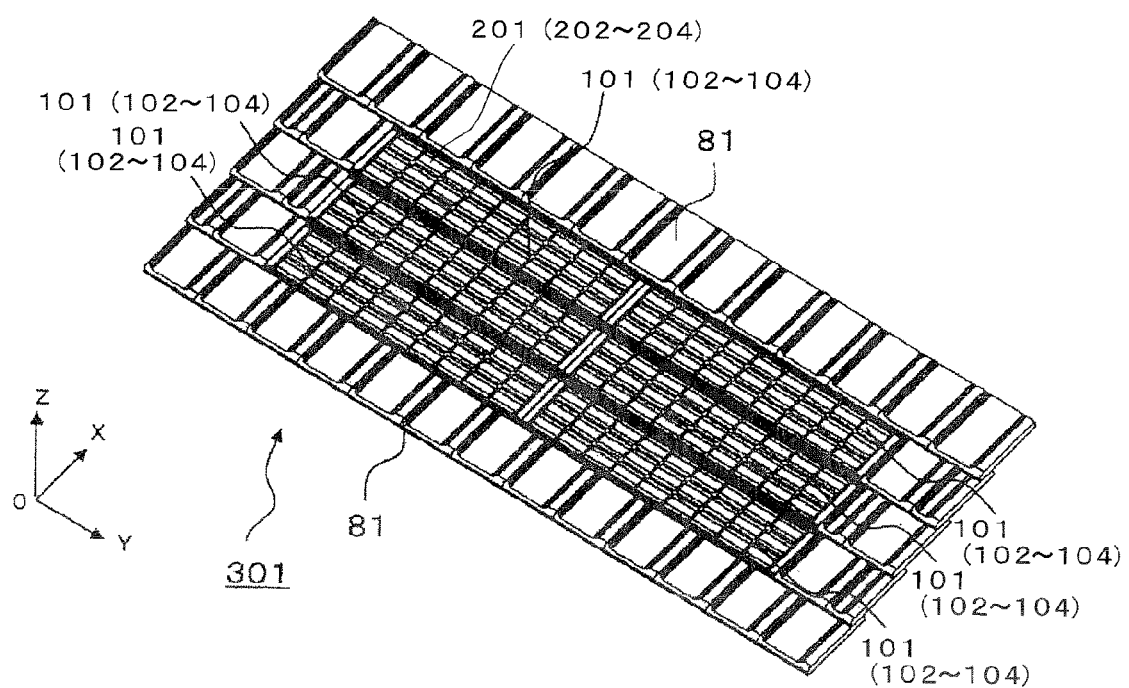

SOLAR CELL MODULE AND METHOD OF MANUFACTURING SOLAR CELL MODULE

TECHNICAL FIELD

The present invention relates to a solar cell module and a method of manufacturing solar cell module.

BACKGROUND ART

A solar cell module typically includes a light-transmitting member, a light-receiving-surface-side sealing material, solar cell strings, a non-light-receiving-surface-side sealing material, and a non-light-receiving-surface-side protective material in order from the light-receiving surface side. Among those, the solar cell string is obtained by connecting bus bar electrodes of a plurality of solar cell elements, which are arranged in line, to each other with inner leads.

Solar cell modules have various structures depending on their use. For example, as described in Japanese Patent Application Laid-Open No. 2003-97000, ones to be arranged on roof tiles and ones to be arranged in place of roof tiles are proposed.

The above-mentioned solar cell modules are installed in a limited space to be replaced with tile materials of a house, and thus have a low degree of flexibility in design on a light-receiving surface. Therefore, a solar cell module is desired to have high strength enough to withstand a snow load and a wind load, and besides, to have a further increased filling rate of solar cell elements on a limited light-receiving surface.

SUMMARY OF THE INVENTION

An object of the present invention is to provide a solar cell module having a high strength while having an increased area ratio of solar cell elements to a solar cell module, and a method of manufacturing solar cell module.

A solar cell module according to one embodiment of the present invention comprises: a solar cell string including a plurality of solar cell elements, each including a first main surface being rectangular in shape and a first bus bar electrode extending along a long side direction on the first main surface, and an interconnection material that connects the solar cell elements adjacent to each other along the long side direction of the first main surface; a light-transmitting member being rectangular in shape that is located to be substantially parallel to the first main surface so as to cover the solar cell string; and a sealing material located between the solar cell string and the light-transmitting member. Each of the plurality of solar cell elements includes a silicon substrate including the first main surface, a second main surface located on the back side of the first main surface, a first side surface connecting the first main surface and the second main surface, and a second side surface that is located on the back side of the first side surface and connects the first main surface and the second main surface. The first side surface and the second side surface are arranged along the long side direction of the first main surface, where silicon is exposed on the first side surface and the second side surface is covered with an insulating layer.

According to the above-mentioned solar cell module, a filling rate of solar cell elements in the solar cell module is increased, which enables to increase a power generation amount and obtain a high strength to an external force.

BRIEF DESCRIPTION OF DRAWINGS

FIGS. 1A to 1D show an embodiment of a solar cell element used in a solar cell module according to a first embodiment of the present invention, where FIG. 1A is a plan view when viewed from the light-receiving surface side, FIG. 1B is a plan view when viewed from the non-light-receiving surface side, FIG. 1C is a cross-sectional view taken along A-A' of FIG. 1A, and FIG. 1D is a cross-sectional view taken along B-B' of FIG. 1A.

FIG. 2A is a plan view when viewed from the light-receiving surface side, and FIG. 2B is a plan view when viewed from the non-light-receiving surface side.

FIGS. 3A and 3B are cross-sectional views taken along C-C' of FIG. 2A.

FIG. 4A is a plan view when viewed from the light-receiving surface side, FIG. 4B is a cross-sectional view taken along D-D' of FIG. 4A, and FIG. 4C is a partially enlarged view of FIG. 4B.

FIGS. 5A to 5F show the state in which a frame is provided to the solar cell module shown in FIGS. 4A to 4C, where FIG. 5A is a top view, FIG. 5B is a plan view, FIG. 5C is a right side view, FIG. 5D is a left side view, FIG. 5E is a bottom view, and FIG. 5F is a rear view.

FIG. 7A is a plan view showing a parent substrate for solar cell elements (solar cell element assembly) when viewed from the light-receiving surface side, and FIG. 7B is a plan view showing the solar cell element obtained from the parent substrate (solar cell element assembly) of FIG. 7A when viewed from the light-receiving surface side.

FIGS. 8A to 8C show a solar cell element used in a solar cell module according to a fifth embodiment of the present invention, where FIG. 8A is a plan view showing the solar cell element viewed from the light-receiving surface side, FIG. 8B is a plan view showing the solar cell element viewed from the non-light-receiving surface side, and FIG. 8C is a cross-sectional view taken along E-E' of FIG. 8A.

FIG. 9A is a plan view showing a solar cell element according to a first modification when viewed from the light-receiving surface side, FIG. 9B is a plan view showing the solar cell element according to the first modification when viewed from the non-light-receiving surface side, FIG. 9C is a cross-sectional view taken along F-F' of FIG. 9A, and FIG. 9D is a plan view showing a solar cell element according to the second modification when viewed from the non-light-receiving surface side.

FIG. 10A is a plan view when viewed from the light-receiving surface side, and FIG. 10B is a cross-sectional view taken along G-G' of FIG. 10A.

FIG. 11 is an exploded perspective view showing the layer configuration of a solar cell module according to a sixth embodiment of the present invention.

12A is a plan view when viewed from the light-receiving surface side, and FIG. 12B is a cross-sectional view taken along H-H' of FIG. 12A.

FIG. 14A is a plan view when viewed from the first main surface side, FIG. 14B is a plan view when viewed from the second main surface side, and FIG. 14C is a cross-sectional view taken along J-J' of FIG. 14A.

FIG. 15A is a plan view when viewed from the first main surface side, FIG. 15B is a plan view when viewed from the second main surface side, and FIG. 15C is a cross-sectional view taken along K-K' of FIG. 15A.

FIG. 16A is a schematic cross-sectional view, and FIG. 16B is a plan view when viewed from the first main surface side.

FIG. 17A is a plan view when viewed from the first main surface side, FIG. 17B is a plan view when viewed from the second main surface side, and FIG. 17C is a cross-sectional view taken along L-L' of FIG. 17A.

FIGS. 19A to 19C show a part of the solar cell string used in the method of manufacturing a solar cell module according to the seventh embodiment of the present invention, where FIG. 19A is a plan view when viewed from the first main surface side, FIG. 19B is a plan view when viewed from the second main surface side, and FIG. 19C is a cross-sectional view taken along M-M' of FIG. 19A.

FIG. 20 is a schematic cross-sectional view of the solar cell element assembly used in the method of manufacturing a solar cell module according to the seventh embodiment of the present invention.

FIG. 22 is a perspective view of a solar cell array including the solar cell module according to the first embodiment of the present invention.

EMBODIMENTS FOR CARRYING OUT THE INVENTION

Solar Cell Module

First Embodiment

Hereinbelow, a solar cell module 101 according to a first embodiment is described in detail with reference to FIGS. 1A to 5F.

Figure 4A:
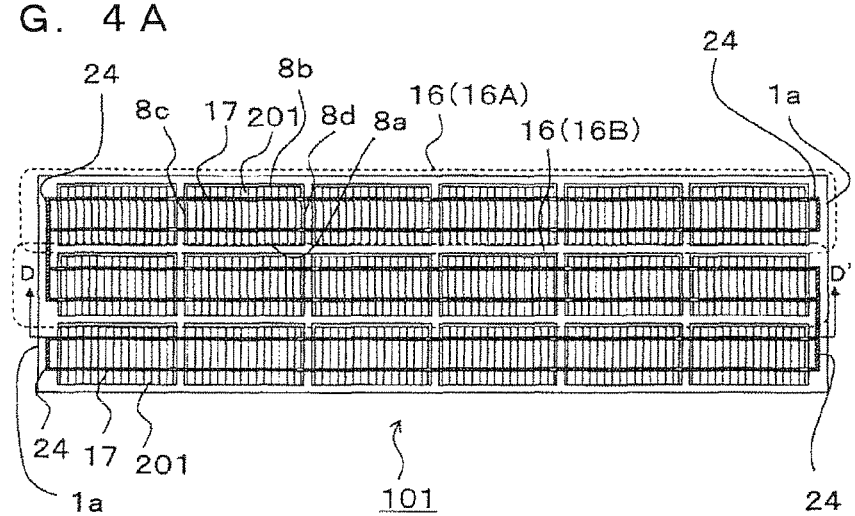
FIGS. 4A to 4C show the solar cell module according to the first embodiment of the present invention, where
Figure 4B:
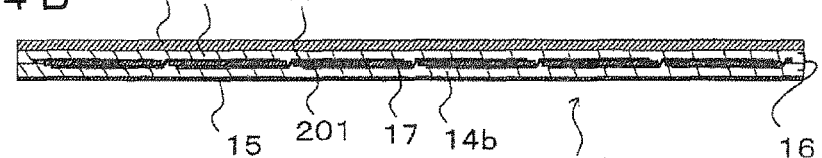
Figure 4C:
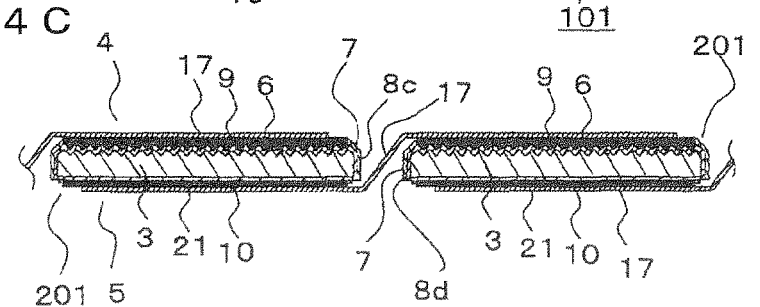

As shown in FIGS. 4A to 4C, the solar cell module 101 according to the first embodiment includes a light-transmitting member 13, a light-receiving-surface-side sealing material 14a, a plurality of solar cell strings 16, a non-light-receiving-surface-side sealing material 14b, and a non-light-receiving-surface-side protective material 15. In the solar cell module 101, the light-transmitting member 13, the light-receiving-surface-side sealing material 14a, the solar cell strings 16, the non-light-receiving-surface-side sealing material 14b, and the non-light-receiving-surface-side protective material 15 are layered in order. In this case, the solar cell string 16 includes a plurality of solar cell elements 201 connected in series.

In the present embodiment, the solar cell module 101 has a rectangular outer shape as shown in FIG. 4A. The solar cell module 101 having the above-mentioned shape can be used to be replaced with about three to six tiles in a case of use as, for example, a building-material-integrated photovoltaic power system. As shown in, for example, FIGS. 5A to 5F, the solar cell module 101 is installed by mounting a frame 26 around the solar cell module 101. The frame 26 may have such a structure as to stop water in collaboration with the frames 26 of the solar cell modules 101 adjacent thereto on the eaves side and ridge side and from side to side in a case where, for example, the solar cell module 101 is used in a building integrated photovoltaic power system.

First, members of the solar cell module 101 are described.

The light-transmitting member 13 has a rectangular shape and is disposed on the light-receiving surface side so as to cover the solar cell strings 16. The light-transmitting member 13 serves to protect the solar cell elements 201 from the outside. It suffices that the light-transmitting member 13 is a member capable of causing light to enter the solar cell elements 201, and a material thereof is not particularly limited. A member having a high light transmittance, which is made of a glass such as a white glass, a toughened glass, and a heat-reflecting glass, or a polycarbonate resin, can be used as the material for the light-transmitting member 13.

The light-receiving-surface-side sealing material 14a is disposed between the light-transmitting member 13 and the solar cell strings 16. The non-light-receiving-surface-side sealing material 14b is disposed between the solar cell strings 16 and the non-light-receiving-surface-side protective material 15. The light-receiving-surface-side sealing material 14a and the non-light-receiving-surface-side sealing material 14b serve to seal the solar cell elements 201. A material that mainly contains ethylene-vinyl acetate copolymer (EVA) and polyvinyl butyral (PVB) and is formed into a sheet-like shape having a thickness of approximately 0.4 to 1 mm by an extruder is used as the light-receiving-surface-side sealing material 14a and the non-light-receiving-surface-side sealing material 14b. Alternatively, the light-receiving-surface-side sealing material 14a and the non-light-receiving-surface-side sealing material 14b may contain a cross-linking agent. In this case, a sheet-like formed body serving as a sealing material is disposed at a desired position and then is heat-treated, whereby the light-receiving-surface-side sealing material 14a and the non-light-receiving-surface-side sealing material 14b can be cured.

The non-light-receiving-surface-side protective material 15 serves to protect the non-light-receiving-surface-side sealing material 14b. For example, polyvinyl fluoride (PVF), polyethylene terephthalate (PET), polyethylene naphthalate (PEN), or a resin obtained by laminating two or more types thereof is used as the material for the non-light-receiving-surface-side protective material 15.

The solar cell element 201 serves to convert incoming sunlight into electricity. As shown in FIGS. 1A to 1D, a light-receiving surface 4 and a non-light-receiving surface 5 of the solar cell element 201 are provided with light-receiving-surface-side bus bar electrodes (first bus bar electrodes) 9 and non-light-receiving-surface-side bus bar electrodes (second bus bar electrodes) 10, respectively. In the present embodiment, the light-receiving surface 4 is a first main surface and the non-light-receiving surface 5 is a second main surface. The solar cell element 201 has a rectangular outer shape having long sides and short sides, and the long sides are approximately parallel to the light-receiving-surface-side bus bar electrodes 9. In a case of polycrystalline silicon, the solar cell element 201 may have a size in which, for example, the long side is approximately 120 to 200 mm and the short side is approximately 60 to 100 mm.

Herein, "being approximately parallel" describes the substantially parallel state. Similarly, "being approximately perpendicular" describes the substantially perpendicular state.

Hereinbelow, the solar cell element 201 used in the solar cell module 101 is described in more detail with reference to the drawings.

As shown in FIGS. 1A to 1D, the solar cell element 201 has an approximately rectangular shape with long sides and short sides. The solar cell element 201 includes a silicon substrate 3, an opposite conductivity type layer 6, and an insulating layer 7. The silicon substrate 3 has the light-receiving surface 4, which is a main surface on the side on which light enters, and the non-light-receiving surface 5, which is located on the back surface of the light-receiving surface 4. The opposite conductivity type layer 6 is provided as a surface layer on the light-receiving surface 4 side of the silicon substrate 3. The insulating layer 7 is provided on the light-receiving surface 4 side of the silicon substrate 3, in the present embodiment, on the opposite conductivity type layer 6.

In addition to the light-receiving surface 4 and the non-light-receiving surface 5, the silicon substrate 3 includes a first side surface 8a, a second side surface 8b, a third side surface 8c, and a fourth side surface 8d. The first side surface 8a is a side surface that connects the light-receiving surface 4 and the non-light-receiving surface 5 and extends along the long side of the light-receiving surface 4. The second side surface 8b is a side surface that is located on the opposite side (back side) to the first side surface 8a, connects the light-receiving surface 4 and the non-light-receiving surface 5, and extends along the long side of the light-receiving surface 4. The third side surface 8c and the fourth side surface 8d are side surfaces among the side surfaces of the silicon substrate 3 other than the first side surface 8a and the second side surface 8b, and are approximately perpendicular to the first side surface 8a and the second side surface 8b. In the present embodiment, the first side surface 8a may be the surface newly formed by division of a parent substrate (solar cell element assembly) as described below.

The solar cell element 201 includes the light-receiving-surface-side bus bar electrodes (first bus bar electrodes) 9 and first current collector electrodes (first finger electrodes) 12, which are provided on the light-receiving surface 4 side of the silicon substrate 3, and the non-light-receiving-surface-side bus bar electrodes (second bus bar electrodes) 10 and a second current collector electrode 11, which are provided on the non-light-receiving surface 5 side of the silicon substrate 3.

Next, components of the solar cell element 201 are described.

Used as the silicon substrate 3 is a crystalline silicon substrate such as a monocrystalline silicon substrate or polycrystalline silicon substrate that contains a predetermined amount of a dopant element (impurity for control of conductivity type) and has one conductivity type (for example, p type). The silicon substrate 3 may be set to have a thickness of, for example, 250 μm or smaller, and further, 150 μm or smaller. The shape of the silicon substrate 3 is not particularly limited, which may be square as in the present embodiment. In this case, the manufacturing method can be simplified. In the present embodiment, a crystalline silicon substrate having a p-type conductivity is used as the silicon substrate 3. In a case where the silicon substrate 3 formed of a crystalline silicon substrate has a p-type conductivity, for example, boron or gallium may be used as the dopant element.

The opposite conductivity type layer 6 is a layer having an opposite conductivity type to that of the silicon substrate 3, and is formed as a surface layer on the light-receiving surface 4 side of the silicon substrate 3. In a case where the silicon substrate 3 is a crystalline silicon substrate having a p-type conductivity, the opposite conductivity type layer 6 has an n-type conductivity. Meanwhile, in a case where the silicon substrate 3 is a crystalline silicon substrate having an n-type conductivity, the opposite conductivity type layer 6 has a p-type conductivity. Formed between the p-type conductivity region and the n-type conductivity region is a pn junction region. If the silicon substrate 3 is a crystalline silicon substrate having a p-type conductivity, the opposite conductivity type layer 6 can be formed by, for example, diffusing impurities such as phosphorous into the light-receiving surface of the crystalline silicon substrate.

The insulating layer 7 is an insulating coat provided on the light-receiving surface 4 side. The insulating layer 7 may serve to reduce a reflectance of the light in a desired wavelength region and increase a photogenerated carrier amount to improve a photocurrent density Jsc of the solar cell element 201. For example, a SiN film, $TiO_2$ film, $SiO_2$ film, or other film can be used as the insulating layer 7. The above-mentioned insulating layer 7 can be formed by, for example, a plasma enhanced chemical vapor deposition (PECVD) method, a vapor deposition method, or a sputtering method. For example, in a case where the insulating layer 7 of a SiN film is formed by the PECVD method, the inside of a reaction chamber is set to approximately 500° C., and a mixed gas of silane ($Si_3H_4$) and ammonia ($NH_3$) diluted with nitrogen ($N_2$) is plasmatized and deposited by glow-discharge decomposition, so that the insulating layer 7 is formed. The thickness of the insulating layer 7 can be appropriately selected depending on a material, which may be such a thickness as to obtain a non-reflective condition for appropriate incoming light. For example, the insulating layer 7 may have a refractive index of approximately 1.8 to 2.3 and a thickness of approximately 500 to 1,200 Å.

In the present embodiment, the second side surface 8b is covered with the insulating layer 7. Meanwhile, silicon is exposed on the first side surface 8a. The insulating layer 7 may also be formed on the third side surface 8c and the fourth side surface 8d. As to the method of forming the insulating layer 7 on the respective side surfaces, the insulating layer 7 can be formed, by the PECVD method as described above, on the second side surface 8b, the third side surface 8c, and the fourth side surface 8d of the silicon substrate 3 which are not covered.

Herein, "silicon is exposed" refers to the state in which another insulating layer or the like is not formed but silicon is substantially exposed, which includes the state in which a natural oxide film is formed.

Further, as shown in FIGS. 1A to 1D, a BSF region 21 having a p+ type is formed in the surface layer portion on the non-light-receiving surface 5 side of the silicon substrate 3 in the solar cell element 201. The BSF region 21 serves to suppress a reduction in power generation efficiency due to recombination of carriers near the non-light-receiving surface 5 of the silicon substrate 3, and forms an internal field on the non-light-receiving surface 5 side of the silicon substrate 3.

Next, electrodes to be provided in the solar cell element 201 are described.

As shown in FIGS. 1A to 1D, the electrodes disposed on the light-receiving surface 4 side of the solar cell element 201 include the light-receiving-surface-side bus bar electrodes 9 (first bus bar electrodes) and the plurality of linear first finger electrodes 12. A part of the light-receiving-surface-side bus bar electrode 9 intersects the first finger electrodes 12. The light-receiving-surface-side bus bar electrode 9 has a width of, for example, approximately 1.3 mm to 2.5 mm. Meanwhile, the first finger electrode 12 may have a width of, for example, approximately 50 to 200 µm. In this manner, the width of the first finger electrode 12 is smaller than the width of the light-receiving-surface-side bus bar electrode 9. The plurality of first finger electrodes 12 are provided at intervals of approximately 1.5 to 3 mm. The light-receiving-surface-side bus bar electrode 9 and the first finger electrode 12 as described above may have a thickness of approximately 10 to 40 µm. The light-receiving-surface-side bus bar electrode 9 and the first finger electrode 12 can be formed by, for example, applying a conductive metal such as silver into a desired shape by screen printing or the like and then firing the applied conductive metal.

As shown in FIGS. 1A to 1D, the electrodes disposed on the non-light-receiving surface 5 side of the solar cell element 201 include the non-light-receiving-surface-side bus bar electrodes 10 (second bus bar electrodes) and the second current collector electrode 11. The non-light-receiving-surface-side bus bar electrode 10 may be set to have a thickness of approximately 10 µm to 30 µm and a width of approximately 1.3 mm to 7 mm. The non-light-receiving-surface-side bus bar electrode 10 can be formed of a similar material and by a similar method to those of the light-receiving-surface-side bus bar electrode 9 described above. The second current collector electrode 11 has a thickness of approximately 15 µm to 50 µm, and is formed over a substantially entire surface of the non-light-receiving surface 5 side of the silicon substrate 3 except for a part such as a region in which the non-light-receiving-surface-side bus bar electrodes 10 are formed. The second current collector electrode 11 can be formed by, for example, applying an aluminum paste into a desired shape and then firing the applied aluminum paste.

The solar cell string 16 includes the plurality of solar cell elements 201 as described above and inner lead 17 (interconnection materials) connecting the solar cell elements 201 adjacent to each other.

Used as the inner lead 17 is a copper foil having a thickness of approximately 0.1 to 0.2 mm and a width of approximately 1 to 2 mm, whose entire surface is coated with a solder. The inner lead 17 is soldered onto the light-receiving-surface-side bus bar electrodes 9 and the non-light-receiving-surface-side bus bar electrode 10 of the solar cell element 201. With reference to FIGS. 4A to 4C, one end of one inner lead 17 is connected to the light-receiving-surface-side bus bar electrode 9 on the light-receiving surface 4 of one solar cell element 201, and the other end thereof is connected to the non-light-receiving-surface-side bus bar electrode 10 on the non-light-receiving surface 5 of the other adjacent solar cell element 201. As a result, the inner lead 17 electrically connects the two adjacent solar cell elements 201. In this case, as shown in FIG. 4C, one end-side region of the inner lead 17 is disposed along the long side direction of the light-receiving-surface-side bus bar electrode 9 of the one solar cell element 201, and the other end-side region thereof is disposed along the long side direction of the non-light-receiving-surface-side bus bar electrode 10 of the other solar cell element 201. Accordingly, as shown in FIG. 4A, the long side direction of the solar cell string 16, the long side direction of the solar cell element 201, and the long side direction of the inner lead 17 are approximately parallel to each other.

As described above, the solar cell module 101 according to the present embodiment includes the solar cell string 16 including the above-mentioned connection and arrangement of the electrodes. As a result, as shown in FIG. 4C, in plan view of the solar cell string 16 from the light-receiving surface 4 side, the inner lead 17 is disposed to be perpendicular to the third side surface 8c and the fourth side surface 8d of the solar cell element 201 and to be approximately parallel to the first side surface 8a. As shown in FIG. 4A, in the solar cell module 101, the plurality of solar cell strings 16 are arranged in the direction perpendicular to the long side direction of the solar cell string 16. The solar cell strings 16 adjacent to each other in the direction perpendicular to the long side direction of the solar cell string 16 are electrically connected to each other by means of connecting members 24.

In the solar cell module 101 according to the present embodiment, as shown in FIG. 4A, the solar cell module 101 and the solar cell string 16 coincide with each other in the long side direction. This enables to dispose the connecting members 24 on a short-length side 1a of the solar cell module 101, which requires a small area for disposing the connecting members 24. Accordingly, an effective light-receiving area to a light-receiving area can be increased. Also, with an increased degree of flexibility in arrangement of the solar cell elements 201, the filling rate of the solar cell elements 201 can be improved. This enables to increase a ratio of an effective light-receiving area to the light-receiving area of the solar cell module 101.

FIG. 22 shows a state in which a solar cell array 301 including the solar cell modules 101 according to the present embodiment, which are supported by a rack, is installed on a roof (installation surface 81). In a case of using the solar cell modules 101 according to the present embodiment as described above, the long side of the module 101, the long side of the solar cell element 201, and the long side direction of the first bus bar electrode 9 are all perpendicular to the eaves-to-ridge direction. As a result, the solar cell array 301 is in harmony with a series of tiles, which increases an aesthetic appearance.

Further, particularly in solar cell modules for tiles that are used in place of tiles as shown in FIG. 22, the outer dimension of the solar cell module is limited to a certain range. In the solar cell module 101 according to the present embodiment shown in FIG. 4A, the short side direction of the solar cell module 101 and the short side direction of the solar cell element 201 coincide with each other. This increases a degree of flexibility in arrangement of the solar cell elements 201 as described above, accordingly this leads to a higher ratio of the effective light-receiving area to the light-receiving area of the solar cell module 101. This enables to increase a power generation amount. Accordingly, the solar cell module 101 can be preferably used as, in particular, a solar cell module for tiles whose outer shape dimension is limited as described above.

Further, in the solar cell module 101, the inner lead 17 is disposed along the long side direction of the solar cell element 201 and is fixed through soldering. As a result, the solar cell element 201 is reinforced along the long side direction, accordingly this leads to a higher strength against bending of the solar cell element 201 in the long side direction. This reduces cracks occurring in the solar cell element 201 and increases the strength in the long side direction of the rectangular solar cell module 101 which tends to bend. This results in improvements in strength and reliability of the solar cell module 101.

As shown in FIG. 1C, the silicon substrate 3 is exposed on the first side surface 8a of the solar cell element 201 and the second side surface 8b thereof is covered with the insulating layer 7. In the present embodiment where the above-mentioned solar cell element 201 is included, as shown in FIGS. 4A and 4C, in plan view of the solar cell string 16 from the light-receiving surface side, the inner lead 17 is disposed so as to perpendicularly intersect the third side surface 8c and the fourth side surface 8d of the solar cell element 201 and to be approximately parallel to the first side surface 8a. In this case, the third side surface 8c and the fourth side surface 8d are covered with the insulating layer 7. This enables to reduce, even in a case where intervals between the solar cell elements 201 are made small and the inner leads 17 come into contact with the side surfaces of the solar cell elements 201, an occurrence of a short circuit due to connecting positive electrodes and negative electrodes of the solar cell elements 201 with the inner leads 17. Accordingly, the solar cell elements 201 can be densely disposed, and a filling rate of the solar cell elements 201 into the light-receiving surface can be increased, accordingly this leads to an improvement in power generation amount of the solar cell module 101.

In the solar cell module 101, the interconnection path connecting the solar cell elements 201 moves back and forth a small number of times, which means a fewer connection spots by the connecting members 24. This enables to reduce a failure rate due to peeling-off of a solder joint and improve reliability.

As described above, in the present embodiment, the long side directions of the respective members are disposed to be approximately parallel to each other, and the solar cell element 201 includes the first side surface 8a on which silicon is exposed and the second side surface 8b covered with the insulating layer 7. This enables to increase a filling rate of the solar cell elements 201 in the solar cell module 101 and obtain a high strength against an external force.

Further, in the present embodiment, as shown in FIG. 4A, the plurality of solar cell elements 201 are arranged in the solar cell string 16 such that the second side surfaces 8b thereof are arranged toward the same direction. In this case, the second side surfaces 8b of the plurality of solar cell elements 201 are disposed to be flush with each other. This arrangement enables to align the solar cell elements 201, with the second side surface 8b as a reference surface, when the solar cell string 16 is formed. Accordingly, in a case where a large solar cell element is divided to form the solar cell elements 201 as described below, an alignment step is less affected by variations in the shape of divided portions of the solar cell elements 201, whereby the light-receiving-surface-side bus bar electrodes 9 and the non-light-receiving-surface-side bus bar electrodes 10 can be accurately aligned in line. As a result, in a mode in which electrodes are provided on both surfaces as in the present embodiment, a reduction of the power generation amount of the solar cell module 101 due to a reduction of a power generation region of the solar cell element 201, which is occurred by making the inner leads 17 be soldered with being displaced from predetermined positions, can also be reduced.

Further, in the present embodiment, of both ends of the first finger electrode 12, the first end located on the first side surface 8a side reaches the first side surface 8a, and the second end located on the second side surface 8b side is spaced from the second side surface 8b.

Further, the solar cell module 101 includes the plurality of solar cell strings 16. Specifically, as shown in FIG. 4A, the solar cell module 101 includes three solar cell strings 16 in the present embodiment. Here, the solar cell string 16 located in an upper portion of FIG. 4A is referred to as a first solar cell string 16A, and the solar cell string 16 adjacent to the first solar cell string 16A is referred to as a second solar cell string 16B.

In this case, the first side surfaces 8a of the plurality of solar cell elements 201 in the first solar cell string 16A are disposed to be located in the first surface, and the second side surfaces 8b of the plurality of solar cell elements 201 in the second solar cell string 16B are disposed to be located in the second surface. The second surface is disposed to be parallel to the first surface and be opposed to the first surface. In the above-mentioned arrangement, in other words, the first side surfaces 8a of the solar cell elements 201 in the first solar cell string 16A are disposed to be opposed to the second side surfaces 8b of the solar cell elements 201 in the second solar cell string 16B. Accordingly, in the adjacent solar cell strings 16, the first side surface 8a on which silicon is exposed and the second side surface 8b covered with the insulating layer 7 are disposed to be opposed to each other. As a result, a distance between the first solar cell string 16A and the second solar cell string 16B can be narrowed. This enables to increase the filling rate of the solar cell elements 201 into the light-receiving surface and further improve the power generation amount of the solar cell module 101.

The solar cell elements 201 used in the solar cell module 101 described above can be formed by various methods. Next, as an example of the formation method, the method of dividing a large solar cell element (hereinbelow, referred to as parent substrate 50 for solar cell elements or solar cell element assembly 50) to form the solar cell elements 201 is described in detail with reference to the drawings.

Figure 2A:
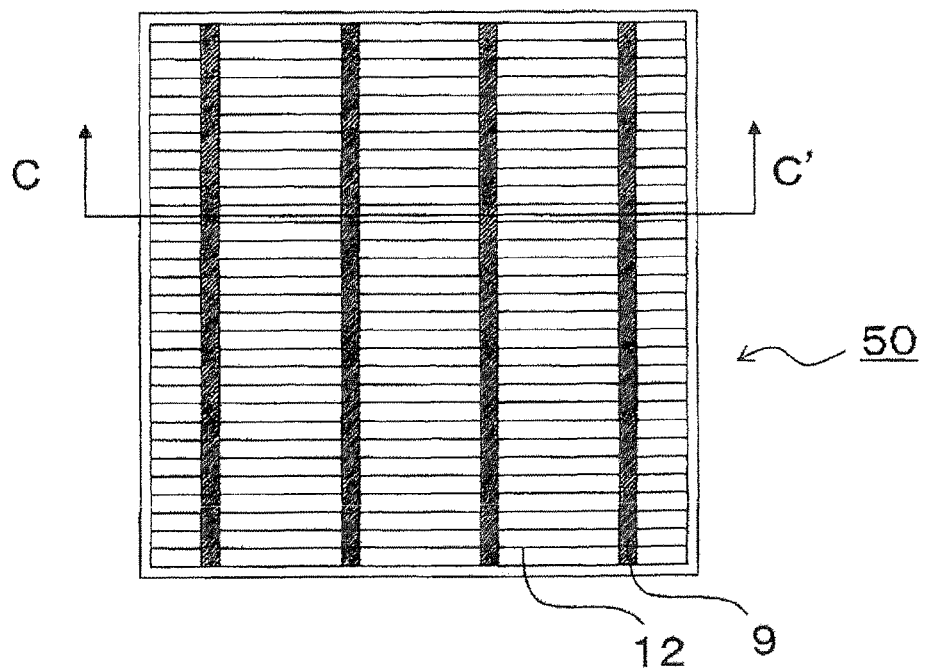
FIGS. 2A and 2B show a parent substrate for solar cell elements (solar cell element assembly) before being divided into the solar cell elements shown in FIGS. 1A to 1D, where
Figure 2B:
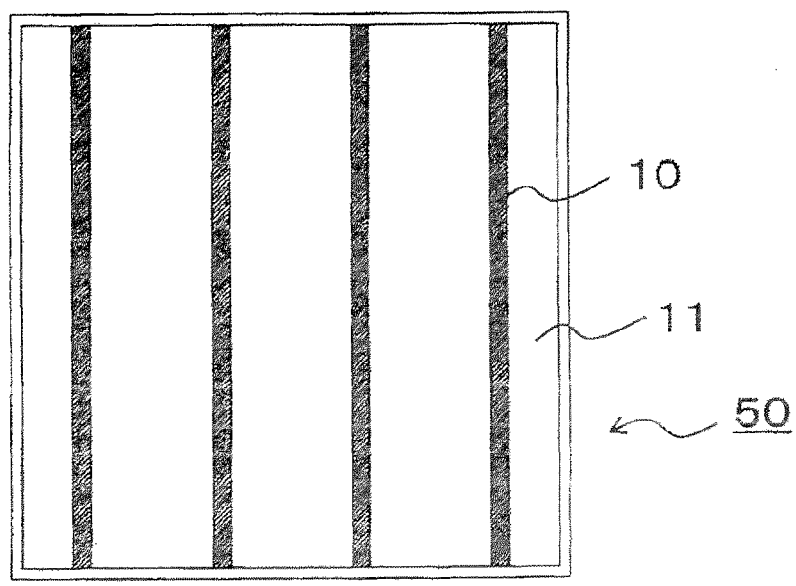

The parent substrate 50 for solar cell elements is one yet to be divided into the solar cell elements 201 as shown in FIGS. 2A and 2B, and is configured to include the plurality of solar cell elements 201. For example, as shown in FIGS. 2A and 2B, the parent substrate 50 for solar cell elements includes the insulating layer 7, the light-receiving-surface-side bus bar electrodes 9, the first finger electrodes 12, the non-light-receiving-surface-side bus bar electrodes 10, and the second current collector electrode 11. The parent substrate 50 is also usable as a solar cell element.

The method of dividing the parent substrate 50 for solar cell elements to form the solar cell elements 201 is described below.

Figure 3A:
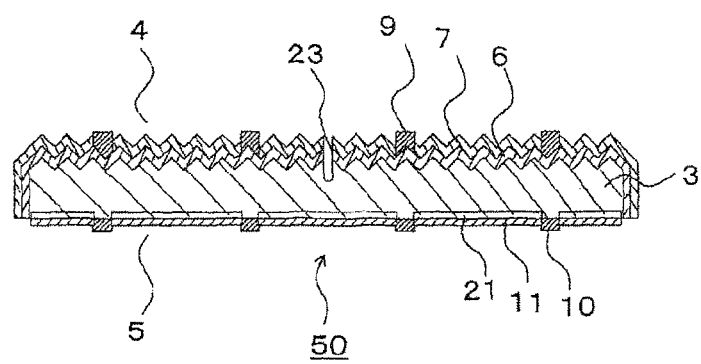
FIGS. 3A and 3B explain the method of forming the solar cell element shown in FIGS. 1A to 1D, where

First, the light-receiving surface 4 of the parent substrate 50 for solar cell elements is irradiated with laser light along a desired dividing line, so that a dividing groove 23 is formed on the light-receiving surface 4 as shown in FIG. 3A. For example, YAG laser light can be used as the laser light for use. As laser conditions, the wavelength, output, beam divergence angle, and scanning speed may be set to 1.06 μm, 10 W to 30 W, 1 to 5 mrad, and 50 to 300 mm/s, respectively. The depth of the dividing groove 23 may be set to, for example, 25% or more of the thickness of the silicon substrate 3, which enables to easily divide the parent substrate 50 for solar cell elements along the dividing groove 23.

Figure 3B:
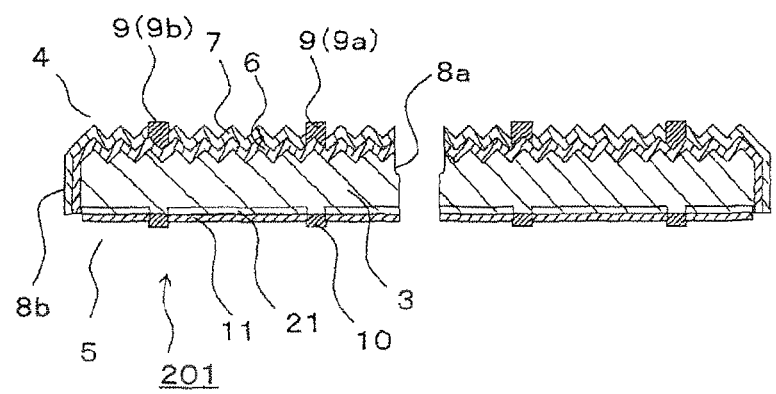

Then, as shown in FIG. 3B, through application of an external force on the parent substrate 50 for solar cell elements in which the dividing groove 23 is formed, the parent substrate 50 for solar cell elements can be divided along the dividing groove 23. As a result, the solar cell elements 201 can be formed. The side surface of the solar cell element 201 formed through the above-mentioned division can serve as the first side surface 8a described above. In this case, the other side surfaces of the solar cell element 201 are the second side surface 8b, the third side surface 8c, and the fourth side surface 8d.

As a result of the formation of the solar cell elements 201 by dividing the parent substrate 50 for solar cell elements in this manner, as shown in FIG. 1C, the cross sections of the silicon substrate 3, the opposite conductivity type layer 6, the BSF region 21, the second current collector electrode 11, and the like are exposed on the first side surface 8a, and the insulating layer 7 is disposed on the other side surfaces. In other words, the formation method as described above enables to form the solar cell element 201 including the first side surface 8a on which silicon is exposed and the second side surface 8b covered with the insulating layer 7.

Second Embodiment

Next, a solar cell module 102 according to a second embodiment of the present invention is described with reference to FIG. 6A. The same components as those of FIG. 1C described above are denoted by same reference symbols in FIG. 6A, which are not described here. The same holds true for the other embodiments described below.

The solar cell module 102 according to the present embodiment differs from the solar cell module 101 according to the first embodiment in positions at which the light-receiving-surface-side bus bar electrodes (first bus bar electrodes) 10 are disposed in a solar cell element 202.

Figure 6A:
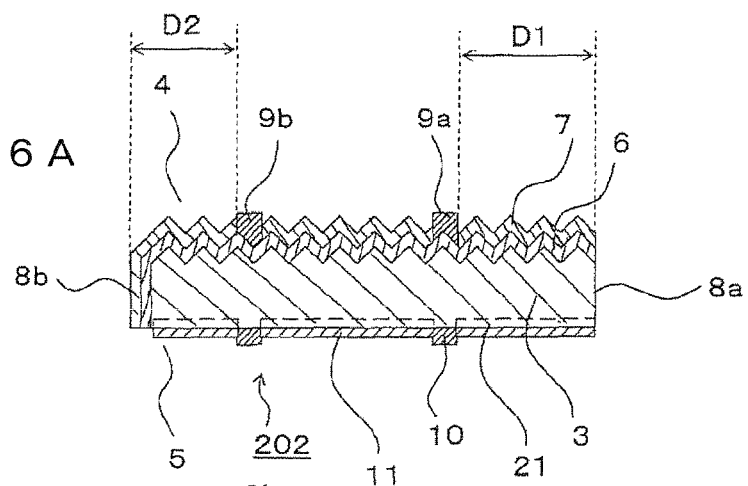
FIG. 6A is a cross-sectional view of a solar cell element used in a solar cell module according to a second embodiment of the present invention.

More specifically, as shown in FIG. 6A, the plurality of light-receiving-surface-side bus bar electrodes 9 and the plurality of non-light-receiving-surface-side bus bar electrodes 10 are provided on the light-receiving surface 4 and the non-light-receiving surface 5, respectively, in the present embodiment. The plurality of light-receiving-surface-side bus bar electrodes 9 include a first-side-surface-side electrode 9a that is the light-receiving-surface-side bus bar electrode 9 closest to the first side surface 8a and a second-side-surface-side electrode 9b that is the light-receiving-surface-side bus bar electrode 9 closest to the second side surface 8b. In this case, a distance D1 between the first-side-surface-side electrode 9a and the first side surface 8a is larger than a distance D2 between the second-side-surface-side electrode 9b and the second side surface 8b.

In a case of the formation through division of the parent substrate 50 for solar cell elements as described above, the first side surface 8a is not covered with the insulating layer 7 and silicon is exposed thereon, whereas the second side surface 8b is covered with the insulating layer 7. Accordingly, a power generation amount per unit area tends to become unequal between the portion near the first side surface 8a and the portion near the second side surface 8b. If the distance D1 between the first-side-surface-side electrode 9a and the first side surface 8a is made larger than the distance D2 between the second-side-surface-side electrode 9b and the second side surface 8b as described above, electrodes can be arranged such that a light receiving amount on the first side surface 8a side is larger than a light receiving amount on the second side surface 8b side. This enables to equalize the currents collected by the first-side-surface-side electrode 9a and the second-side-surface-side electrode 9b. Accordingly, the currents passing through the first-side-surface-side electrode 9a, the second-side-surface-side electrode 9b, and the inner lead 17 become equal to each other, which does not require to change the cross-sectional areas of the light-receiving-surface-side bus bar electrode 9 and the inner lead 17 in accordance with a current. As a result, the inner lead 17 to be connected to the first-side-surface-side electrode 9a and the second-side-surface-side electrode 9b can be limited to one type, which enhances the versatility thereof. Then, the currents are evenly distributed within the solar cell module 102, which enables to improve power generation efficiency of the solar cell module 102.

In the present embodiment, as described above, the currents are distributed as evenly as possible within the solar cell module 102, the power generation efficiency is improved, and excellent versatility is provided.

The distance D1 herein can be set to, for example, the shortest distance between the first-side-surface-side electrode 9a and the first side surface 8a in the direction perpendicular to the long side direction of the light-receiving surface 4 in plan view of the solar cell element 202, as shown in FIG. 6A. The distance D2 can be defined similarly.

Third Embodiment

Figure 7A:
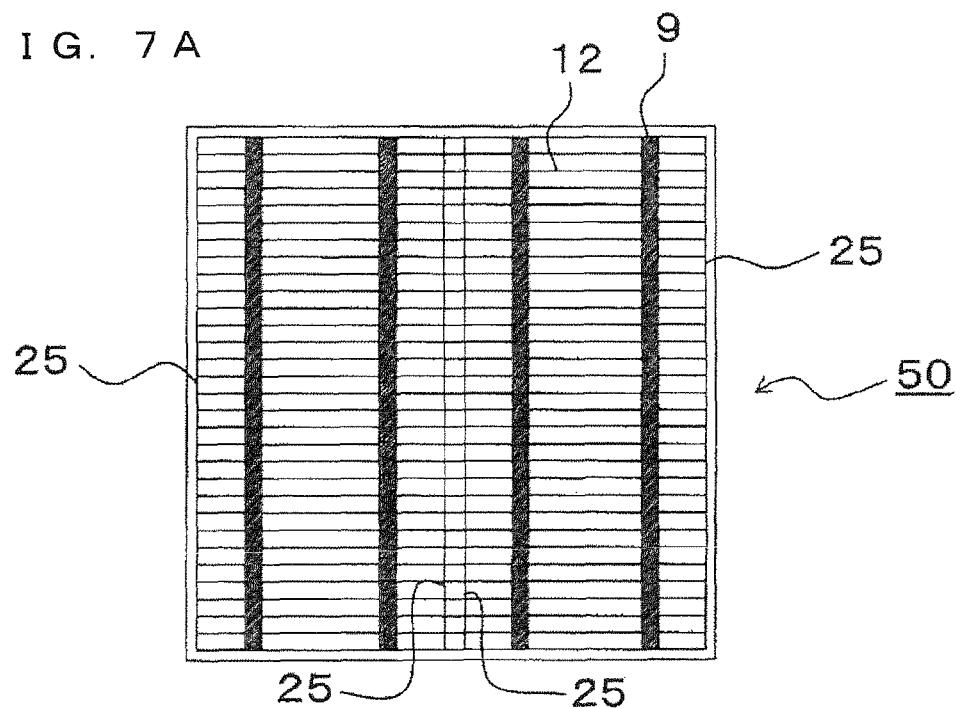
FIGS. 7A and 7B show a solar cell element used in a solar cell module according to a third embodiment of the present invention, where

Next, a solar cell module 103 according to a third embodiment of the present invention is described with reference to FIGS. 7A and 7B. The solar cell module 103 according to the present embodiment differs from the solar cell module 101 according to the first embodiment in the configuration of the electrodes provided on the light-receiving surface side in a solar cell element 203.

Figure 7B:
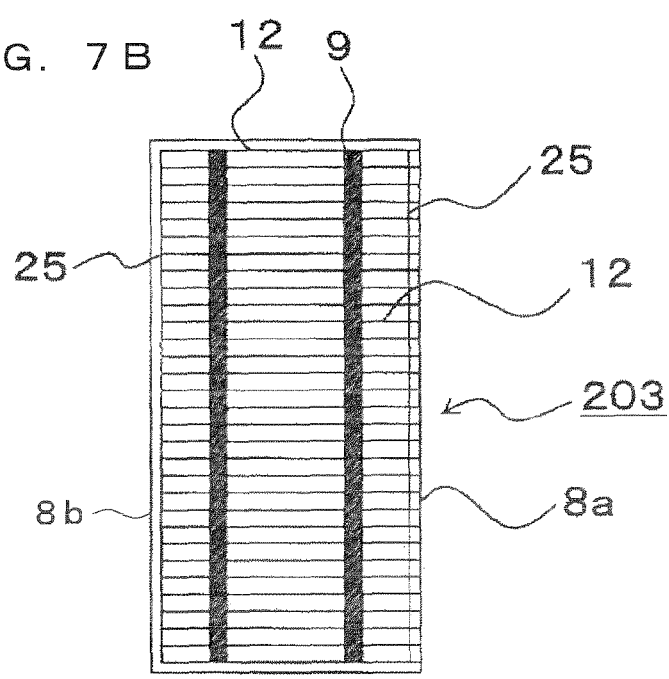

Specifically, as shown in FIG. 7B, the solar cell element 203 used in the solar cell module 103 according to the third embodiment further includes auxiliary electrodes 25 as the electrodes provided on the light-receiving surface side, which are described regarding the solar cell element 201 according to the first embodiment. In other words, the solar cell element 203 includes the light-receiving-surface-side bus bar electrodes 9, the first finger electrodes 12, and the auxiliary electrodes 25 as the electrodes provided on the light-receiving surface side.

The light-receiving-surface-side bus bar electrodes 9 extend along the long side direction of the light-receiving surface 4. The first finger electrodes 12 extend in the direction approximately perpendicular to the light-receiving-surface-side bus bar electrodes 9 and are electrically connected to the light-receiving-surface-side bus bar electrodes 9.

The auxiliary electrodes 25 are disposed in the direction perpendicular to the plurality of first finger electrodes 12 along the outer perimeter of the light-receiving surface 4 of the solar cell element 203. In other words, the auxiliary electrodes 25 are disposed to extend in the direction approximately parallel to the light-receiving-surface-side bus bar electrodes 9 on the light-receiving surface 4. Specifically, as shown in FIG. 7B, two auxiliary electrodes 25 are provided in the present embodiment; one extending along the first side surface 8a and the other extending along the second side surface 8b. The auxiliary electrodes 25 are electrically connected to the light-receiving-surface-side bus bar electrodes 9 through the first finger electrodes 12. By providing the auxiliary electrodes 25 as described above, the efficiency of collecting the currents generated in the solar cell element 203 can be increased.

Further, as described above, the auxiliary electrode 25 is provided along the first side surface 8a in the present embodiment. Accordingly, even if the first finger electrodes 12 peel off from the first side surface 8a side that is formed through division of the parent substrate 50 for solar cell elements, the auxiliary electrode 25 functions as a stopper for preventing the peeling-off from progressing inwardly beyond the auxiliary electrode 25. Even in a case where the solar cell element 203 is formed by dividing the parent substrate 50 for solar cell elements, the first finger electrodes 12 can be less damaged, and the deterioration of power generation efficiency along with the damage can be reduced. This enables to further improve the reliability of the solar cell module 103.

Fourth Embodiment

Next, a solar cell module 104 according to a fourth embodiment of the present invention is described with reference to FIG. 6B. The solar cell module 104 according to the present embodiment differs from the solar cell module 101 according to the first embodiment in the configuration of a solar cell element 204.

Figure 6B:
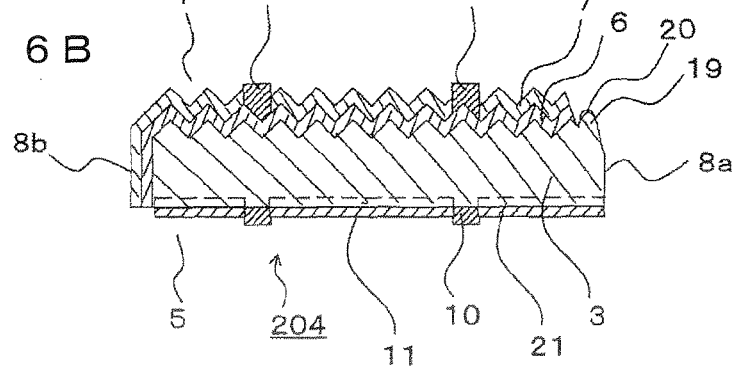
FIG. 6B is a cross-sectional view of a solar cell element used in a solar cell module according to a fourth embodiment of the present invention.

Specifically, as shown in FIG. 6B, the solar cell element 204 used in the solar cell module 104 according to the fourth embodiment further includes a first bump 19 that is provided at an intersection portion of the first side surface 8a and the light-receiving surface 4. The first bump 19 as described above can be formed by, for example, adjusting an output of laser light when the solar cell element 204 is produced by cutting the parent substrate 50 with laser light from the light-receiving surface 4 side or the non-light-receiving surface 5 side.

As described above, the solar cell element 204 may be formed by formation of a groove with laser light and then division through snapping. In that case, the first side surface 8a can be reinforced by providing the above-mentioned first bump 19, which enables to reduce a progression of a micro-crack occurring on the first side surface 8a.

While the present embodiment has described the first bump 19 provided at the intersection portion of the first side surface 8a and the light-receiving surface 4, a second bump may be further provided at an intersection portion of the first side surface 8a and the non-light-receiving surface 5. Also in this mode, an occurrence of a micro-crack on the first side surface 8a due to division can be reduced. Even in a mode in which the first bump 19 is not provided and only the second bump is provided, similar effects to the effects obtained by providing the first bump 19 can be achieved. Therefore, at least one of the first bump 19 and the second bump can be appropriately provided in accordance with various elements such as the structure of the solar cell element 204.

Further, in the present embodiment, the solar cell element 204 further includes a first oxide film 20 provided on the first bump 19. The above-mentioned first oxide film 20 can be formed by, when forming the solar cell element 204 through laser cutting, bringing a gas containing oxygen into contact with the portion irradiated with laser light, in place of an argon gas.

In a case where the above-mentioned first oxide film 20 is formed on the surface of the first bump 19 to connect a plurality of solar cell elements 204 by means of the inner leads 17 in a connection arrangement similar to that of the solar cell module 101 according to the first embodiment described above, the first oxide film 20 functions as an insulating layer. This enables to reduce a short circuit due to connecting the positive electrodes and negative electrodes of the solar cell elements 204 with the inner leads 17.

Further, while the first oxide film 20 is formed only on the surface of the first bump 19 in the present embodiment as shown in FIG. 6B, the first oxide film 20 may be formed to extend inwardly beyond the first bump 19. This enhances the passivation effect by the first oxide film 20.

While the present embodiment has illustrated the solar cell element 204 that includes the first bump 19 provided on the light-receiving surface 4 side and does not include the second bump provided on the non-light-receiving surface 5 side, in another mode, a second bump may be provided as an another embodiment as described above. In this mode, a second oxide film may be provided on the surface of the second bump. Similar effects to the effects obtained by providing the first oxide film 20 described above can be achieved also in this mode. The second oxide film can be formed by a similar method to that of the first oxide film 20 described above.

Fifth Embodiment

Figure 9A:
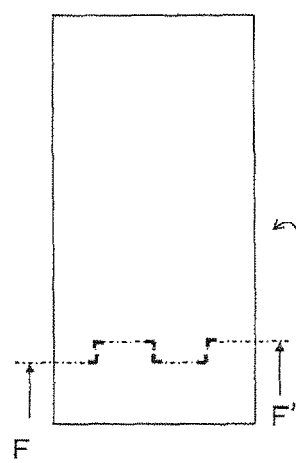
FIGS. 9A to 9D show modifications of the solar cell element used in the solar cell module according to the fifth embodiment of the present invention, where
Figure 9B:
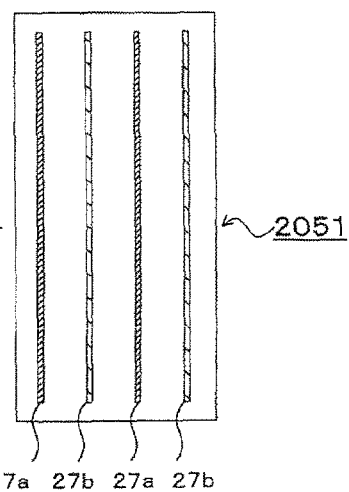
Figure 9C:
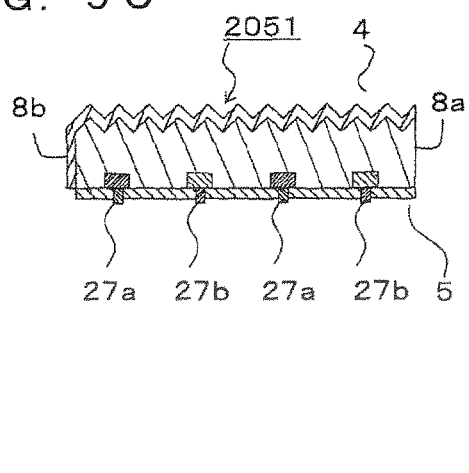
Figure 9D:
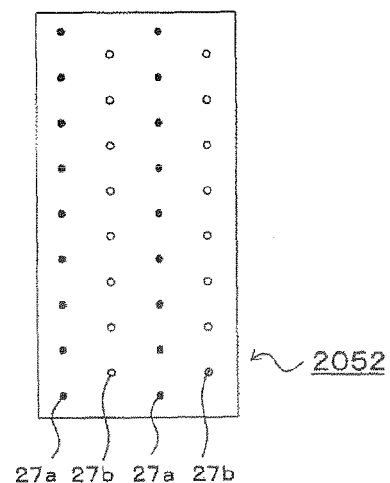

Next, a solar cell module 105 according to a fifth embodiment of the present invention is described with reference to FIGS. 8A to 10B. FIGS. 8A to 8C, 10A and 10B show a solar cell element 205 used in the solar cell module 105 according to the fifth embodiment, FIGS. 9A to 9C show a first modification 2051 of the solar cell element 205, and FIG. 9D shows a second modification 2052 of the solar cell element 205.

The solar cell module 105 according to the present embodiment differs from the solar cell module 101 according to the first embodiment in the configuration of the solar cell element 205.

Specifically, the solar cell element 205 used in the solar cell module 105 according to the fifth embodiment has a back contact structure. That is, as shown in FIGS. 8A to 8C, the solar cell element 205 includes first output extraction electrodes 27a and second output extraction electrodes 27b having polarities different from each other on the non-light-receiving surface 5. In other words, the electrodes corresponding to the first bus bar electrodes 9 and the second bus bar electrodes 10 according to the first to fourth embodiments described above are all provided on the non-light-receiving surface 5.

More specifically, in the present embodiment, the first output extraction electrode 27a and the second output extraction electrode 27b correspond to the first bus bar electrode and the second bus bar electrode, respectively. Therefore, in the present embodiment, the non-light-receiving surface 5 on which the first bus bar electrodes are provided serves as the first main surface.

The solar cell element 205 has a rectangular outer shape having long sides and short sides, and the long side is approximately parallel to the first output extraction electrode 27a and the second output extraction electrode 27b. For example, the solar cell element 205 has such a size that the long side is approximately 120 to 200 mm and the short side is approximately 60 to 100 mm in the case of polycrystalline silicon. Also in the present embodiment, silicon is exposed on the first side surface 8a as in the first embodiment.

The solar cell element 205 according to the present embodiment has a crystal-based metal wrap-through structure as shown in FIGS. 8A to 8C.

Figure 10A:
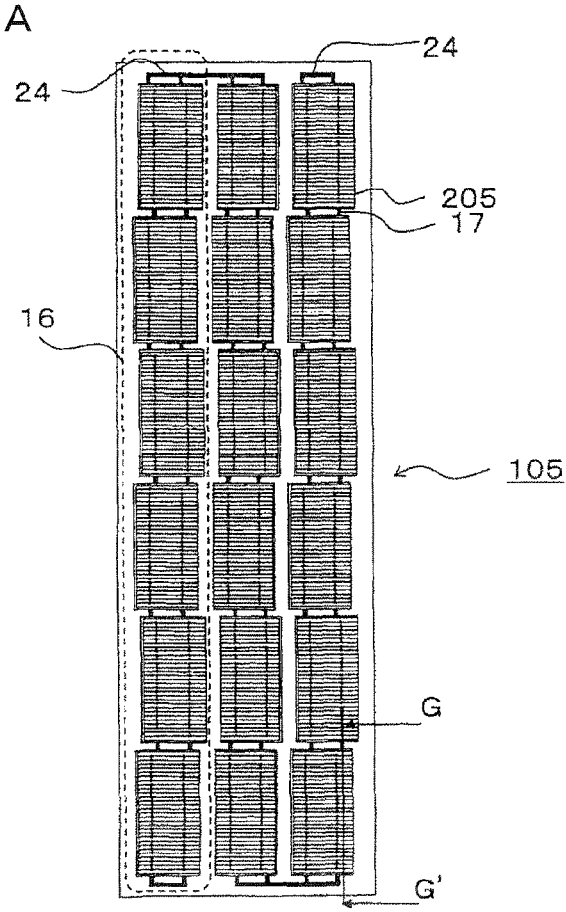
FIGS. 10A and 10B show the solar cell module according to the fifth embodiment of the present invention, where
Figure 10B:
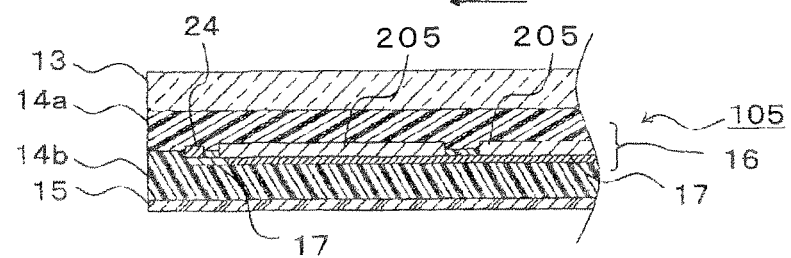

Also in the present embodiment, the solar cell string 16 includes a plurality of solar cell elements 205 as in the embodiments described above. As shown in FIGS. 10A and 10B, the plurality of solar cell elements 205 are connected to each other by the inner leads 17 in the solar cell string 16. In addition to the plurality of solar cell strings 16, the solar cell module 105 includes the light-transmitting member 13, the light-receiving-surface-side sealing material 14a, the non-light-receiving-surface-side sealing material 14b, and the non-light-receiving-surface-side protective material 15. As shown in FIG. 10B, the light-transmitting member 13, the light-receiving-surface-side sealing material 14a, the solar cell strings 16, the non-light-receiving-surface-side sealing material 14b, and the non-light-receiving-surface-side protective material 15 are layered in this order in the solar cell module 105.

The present embodiment having a back contact structure differs from the first to fourth embodiments in the arrangement of the inner leads 17. That is, in the first to fourth embodiments, one end of the inner lead 17 is located on the light-receiving surface 4 side of one of the adjacent solar cell elements 201 to 204, and the other end thereof is located on the non-light-receiving surface 5 side of the other of the adjacent solar cell elements 201 to 204. Meanwhile, in the present embodiment, one end and the other end of the inner lead 17 are both disposed on the non-light-receiving surface 5 side of the adjacent solar cell elements 205 corresponding thereto.

Also in the above-mentioned solar cell module 105, as shown in FIG. 10A, the plurality of solar cell strings 16 are arranged in the direction perpendicular to the long side direction thereof. The solar cell strings 16 perpendicularly adjacent to each other are electrically connected by means of the connecting member 24.

As in the embodiments described above, a filling rate of the solar cell elements 205 can be improved to increase a ratio of an effective light-receiving area to a light-receiving area in the above-mentioned solar cell module 105. In addition, the inner leads 17 are soldered along the long side direction of the solar cell element 205, and thus, the solar cell element 205 is reinforced along the long side direction thereof. This enables to increase the strength of the solar cell element 205 against bending in the long side direction.

Through the above, also in the present embodiment, the power generation efficiency can be increased and the strength to an external force can be improved by increasing the filling rate of the solar cell elements 205.

The present embodiment has described the mode in which the solar cell element having a metal wrap-through structure as shown in FIGS. 8A to 8C is provided as a mode in which a back contact structure is provided. Alternatively, a solar cell element having another back contact structure may be used as a solar cell element used in the solar cell module according to the embodiment of the present invention.

FIGS. 9A to 9C show the first modification 2051 of the solar cell element 205 according to the fifth embodiment having a back contact structure. The first modification 2051 has an integrated back contact (IBC) structure. As shown in FIG. 9A, electrodes are not formed on the light-receiving surface 4 in the first modification 2051. As shown in FIG. 9B, meanwhile, the first output extraction electrodes 27a corresponding to the first bus bar electrodes and the second output extraction electrodes 27b corresponding to the second bus bar electrodes are linearly formed on the non-light-receiving surface 5.

In the case of using the solar cell element 205 in this modification, it is sufficient that, as shown in FIG. 9B, the "first bus bar electrodes extending along the long side direction on the first main surface" are the first output extraction electrodes 27a being the first bus bar electrodes provided so as to extend along the long side direction of the non-light-receiving surface 5 on the non-light-receiving surface 5 being the first main surface. Similar effects to those of the fifth embodiment in which the solar cell elements 205 are used can be achieved also in this mode.

FIG. 9D is a plan view on the non-light-receiving surface 5 side of the second modification 2052 of the solar cell element 205 according to the fifth embodiment having a back contact structure. The second modification 2052 has the IBC structure similarly to the first modification 2051. The second modification 2052 differs from the first modification 2051 in the shapes of the electrodes on the non-light-receiving surface 5 side as shown in FIG. 9D.

More specifically, also in the second modification 2052, the first output extraction electrodes 27a corresponding to the first bus bar electrodes and the second output extraction electrodes 27b corresponding to the second bus bar electrodes are formed on the non-light-receiving surface 5 as in the first modification 2051. The first output extraction electrodes 27a and the second output extraction electrodes 27b are linearly formed in the first modification 2051, whereas the first output extraction electrodes 27a and the second output extraction electrodes 27b are circularly formed in the second modification 2052.

In a case of using the solar cell elements 205 in this modification, it is sufficient that the "first bus bar electrodes extending along the long side direction on the first main surface" are the plurality of circular first output extraction electrodes 27a provided so as to be arranged along the long side direction of the non-light-receiving surface 5 on the non-light-receiving surface 5. As in the first modification 2051, similar effects to those of the fifth embodiment in which the solar cell elements 205 are used can be achieved also in this mode.

While the metal wrap-through structure and the IBC structure have been illustrated as the back contact structure, other back contact structure may be used. Examples of the other back contact structure include an emitter wrap-through structure and an around wrap-through structure. In any of the back contact structures, crystalline silicon such as a polycrystalline silicon or monocrystalline silicon can be used as the material for the solar cell element as described above.

Sixth Embodiment

Next, a solar cell module 106 according to a sixth embodiment of the present invention is described with reference to FIGS. 11 to 13B. The solar cell module 106 according to the present embodiment differs from the solar cell module 105 according to the fifth embodiment in the configuration of connecting a plurality of solar cell elements to each other. In other words, the solar cell module 106 according to the present embodiment differs from the solar cell module 105 according to the fifth embodiment in the solar cell string 16.

Specifically, in the solar cell module 106 according to the present embodiment, the solar cell string 16 includes a plurality of solar cell elements 2, a connecting sheet 28, an adhesive layer 32, and a bonding material 33. Here, the solar cell module 106 according to the present embodiment includes the connecting sheet 28, the adhesive layer 32, and the bonding material 33 in place of the inner leads 17 in the solar cell module 105 according to the fifth embodiment.

Figure 12A:
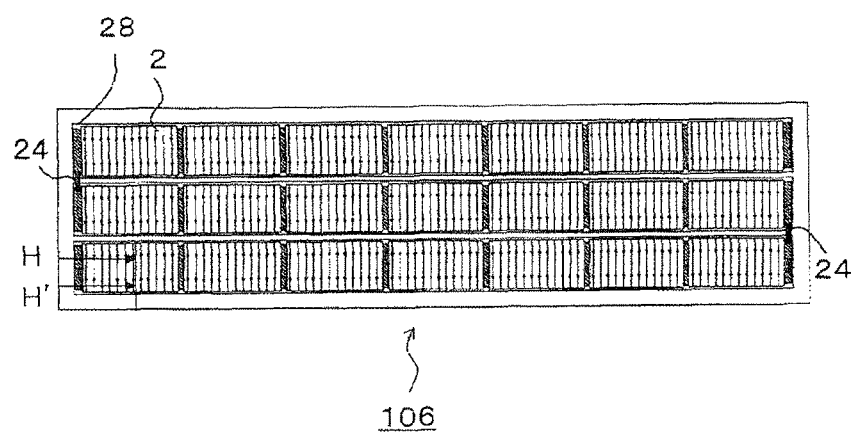
FIGS. 12A and 12B show the solar cell module according to the sixth embodiment of the present invention, where FIG.
Figure 12B:
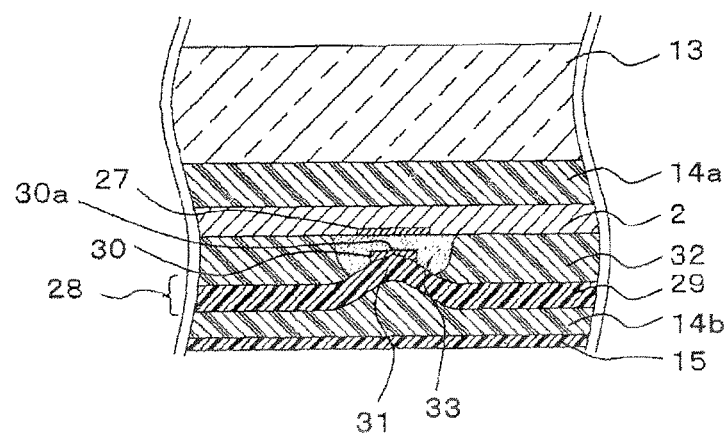

As shown in FIG. 11, in the solar cell string 16 according to the present embodiment, the non-light-receiving surfaces 5 of the plurality of solar cell elements 2 are connected to each other by the connecting sheet 28. Therefore, in the present embodiment, the solar cell element 2 has the same structure as that of the solar cell element 205 used in the solar cell string 16 according to the fifth embodiment and, specifically, has the back contact structure shown in FIGS. 8A to 8C. In the present embodiment, as shown in FIGS. 11 and 12B, the adhesive layer 32 and the bonding material 33 are disposed between the solar cell elements 2 and the connecting sheet 28.

As in the fifth embodiment, also in the solar cell module 106, the light-transmitting member 13, the light-receiving-surface-side sealing material 14a, the solar cell strings 16, the non-light-receiving-surface-side sealing material 14b, and the non-light-receiving-surface-side protective material 15 are layered in the stated order from the light-receiving surface 4 side.

In the present embodiment, the connecting sheet 28 serves to electrically connect the solar cell elements 2 disposed adjacent to each other, as described above.

Specifically, as shown in FIG. 11, the connecting sheet 28 includes a substrate sheet 29 and a circuit layer 30 that functions as an interconnection material. As shown in FIG. 12B, the connecting sheet 28 includes a protrusion 31. The protrusion 31 is provided so as to project toward the solar cell element 2 at the position for electrical connection with the solar cell element 2, that is, at the position corresponding to the output extraction electrode 27 (the first output extraction electrode 27a and the second output extraction electrode 27b) on one main surface of the connecting sheet 28. The protrusion 31 as described above can be formed by, for example, pressing the connecting sheet 28.

Figure 13A:
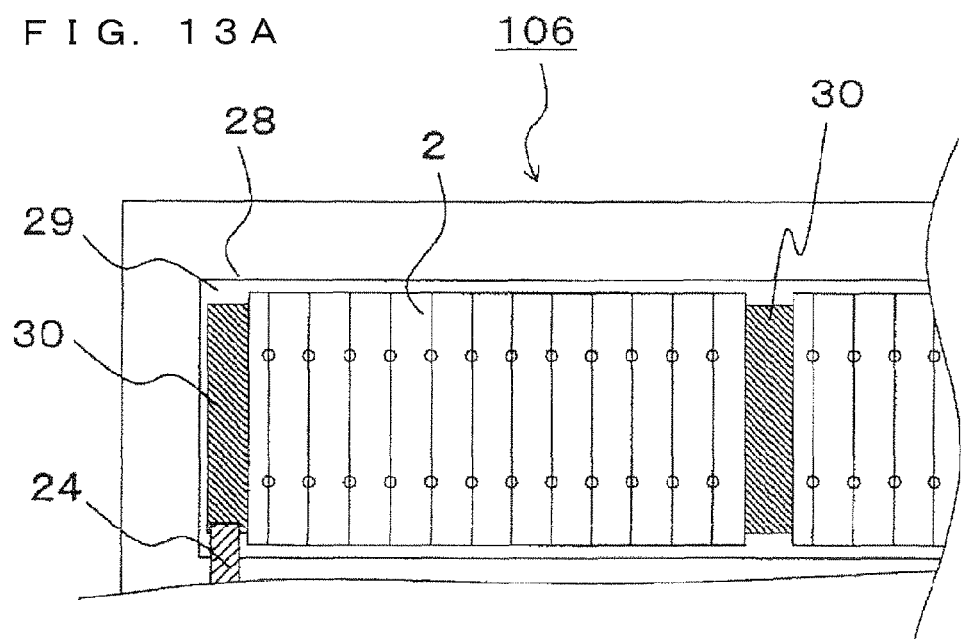
FIG. 13A is a partially enlarged plan view of a solar cell string used in the solar cell module according to the sixth embodiment of the present invention.

As shown in FIG. 11, the circuit layer 30 is disposed on one main surface of the substrate sheet 29 so as to electrically connect the first output extraction electrode 27a of the first solar cell element 2b and the second output extraction electrode 27b of the second solar cell element 2c, where the first solar cell element 2b and the second solar cell element 2c are disposed adjacent to each other. The circuit layer 30 is disposed at the positions opposed to the first output extraction electrode 27a and the second output extraction electrode 27b of the solar cell element 2 on the main surface of the substrate sheet 29, and has a comb shape. As shown in FIG. 13A, the base portion of the comb of the circuit layer 30 is disposed between the two adjacent solar cell elements 2 in the arrangement direction of the solar cell elements 2.

The portion of the circuit layer 30, which electrically connects the connecting sheet 28 and the solar cell element 2, is disposed on the top surface of the protrusion 31 of the connecting sheet 28 described above. Hereinbelow, as shown in FIG. 12B, the top surface of the portion of the circuit layer 30, which is disposed at the protrusion 31, is referred to as a contact portion 30a.

The circuit layer 30 can be formed by, for example, sputtering a conductive metal on the substrate sheet 29 or attaching an etching metal film thereto. It suffices that the metal material used for the circuit layer 30 is a conductive metal and, for example, may be copper, aluminum, gold, silver, or an alloy thereof.

As shown in FIG. 12B, the adhesive layer 32 is disposed in a portion on one main surface of the substrate sheet 29 other than a portion in which the circuit layer 30 is disposed. Examples of the material for the adhesive layer 32 include ethylene-vinyl acetate copolymer (EVA), polyvinyl butyral (PVB), and an epoxy resin. The adhesive layer 32 can be formed by, for example, layering a thin film of EVA, PVB, or epoxy resin at a desired position on the substrate sheet 29. In a case where the above-mentioned adhesive layer 32 is provided, a leakage current from the solar cell element 2 to the circuit layer 30, which is generated at a position other than the contact portion 30a, reduces, whereby the reliability and output can be improved.

The substrate sheet 29 serves to hold the circuit layer 30 of the connecting sheet 28 and, in the present embodiment, has a rectangular shape in plan view. Examples of the material that can be used for the substrate sheet 29 include polyethylene terephthalate (PET), polyethylene naphthalate (PEN), and polyvinyl fluoride (PVF). In a case where the substrate sheet 29 is heated to 200° C. or higher in the production step in which solder is used for the bonding material 33 described below, it is sufficient that resins having excellent heat resistance, such as polyimide (PI), polyamideimide (PAI), polyether ether ketone (PEEK), polytetrafluoroethylene (PTFE), and polyethersulfone (PES) may be used as the material for the substrate sheet 29.

A multiple layer sheet obtained by combining a plurality of films comprised of a material such as the above-mentioned resin may be used as the substrate sheet 29, in addition to the use of a single layer sheet of a film comprised of the above-mentioned material. In the case where the substrate sheet 29 is formed of a multiple layer sheet as described above, humidity resistance, heat resistance, electrical insulating properties, and mechanical properties can be enhanced.

The substrate sheet 29 may further include a moisture barrier layer (not shown). The moisture barrier layer is disposed between films formed of a material such as the above-mentioned resin such as PET and PEN. An aluminum foil, a galvanized iron foil, a stainless steel foil, a deposition layer of silica and aluminum, or the like can be used as the moisture barrier layer. In this case, long-term humidity resistance can be improved.

Alternatively, the connecting sheet 28 may contain a low resistance metal or flux disposed so as to cover the contact portion 30a. In other words, the contact portion 30a to be connected to the output extraction electrode 27 (first output extraction electrode 27a and second output extraction electrode 27b) of the solar cell element 2 may be covered with gold or applied with flux for soldering in advance so as to be electrically connected to the solar cell element 2 reliably.

The bonding material 33 serves to electrically and mechanically bond the output extraction electrode 27 (first output extraction electrode 27a and second output extraction electrode 27b) of the solar cell element 2 and the contact portion 30a of the circuit layer 30. For example, leaded solder, lead-free solder, or a conductive adhesive can be used as the bonding material 33 as described above.

First, description is given of the case of using leaded solder or lead-free solder for the bonding material 33. For example, Pb—Sn eutectic solder can be used as the leaded solder. From the viewpoint of suppressing deterioration of the solar cell element 2 and the connecting sheet 28 due to the heat when boding, solder having a low melting point can be used as the lead-free solder that is used for reducing an environmental burden. Lead-free solder having high wettability to the output extraction electrode 27, high bonding strength and high fatigue strength may be appropriately selected. Examples of the material of lead-free solder described above include medium-low melting temperature Sn—Zn and Sn—Zn—Bi, medium melting temperature Sn—In—Ag—Bi and Sn—Ag—Bi—Cu, and medium-high melting temperature Sn—Ag—Cu and Sn—Ag. In the case where solder is used for the bonding material 33, the bonding material 33 may be provided by covering the contact portion 30a of the circuit layer 30 described above with solder in advance, for simplifying a production step.

Next, description is given of a case in which a conductive adhesive is used for the bonding material 33. The conductive adhesive contains a metal filler having conductivity and a binder resin having bonding properties. Specifically, the conductive adhesive is obtained by kneading the above-mentioned metal filler and binder resin.

For example, gold, silver, copper, nickel, aluminum, carbon, graphite and the like can be used as a material for the metal filler. For example, the shape of the metal filler may be appropriately selected from flake, granular, wedge, and other shapes. In particular, a flake-shaped material having high conductivity or a wedge-shaped material having high conductivity and high adhesion may be used as the metal filler.

The bonding material 33 is cured between layers, which is sealed between the connecting sheet 28 and the solar cell element 2, and thus, a resin that generates a small amount of outgassing can be used as the binder resin. From the viewpoint of reducing the temperature histories of the solar cell element 2 and the connecting sheet 28, a rein that is crosslinked and cured at a low temperature can be used as the binder resin. Alternatively, a resin that gradually starts crosslinking after the non-light-receiving-surface-side filler 14b starts becoming softened in lamination and ends crosslinking and curing before the end of lamination may be used as the binder resin. In this case, the output extraction electrode 27 and the contact portion 30a can be electrically connected with high accuracy. In the case where ethylene-vinyl acetate (EVA) is used for the non-light-receiving-surface-side filler 14b, the crosslinking temperature of the binder resin may be set to, for example, a temperature higher than approximately 70° C. that is a melting point before crosslinking of EVA. Examples of the above-mentioned binder resin include one-part and two-part epoxy adhesives. In addition to the epoxy adhesives, urethane adhesives, silicon adhesives, acrylic adhesives, and polyimide adhesives can be selected as the binder resin.

In place of the above-mentioned solder or conductive adhesive, a pressure sensitive adhesive double coated tape having conductivity may be used as the bonding material 33. The pressure sensitive adhesive tape as described above can be mechanically and electrically connected without heating, and thus can crimp the components that are overlaid on each other with a pressure sensitive adhesive tape. This enables to reduce poor conduction occurring between the contact portion 30a and the output extraction electrode 27 due to displacement before and during lamination.

Next, a modification 1061 of the solar cell module 106 according to the present embodiment is described with reference to FIG. 13B. The modification 1061 differs from the solar cell module 106 according to the sixth modification in the configuration of the connecting sheet 28.

That is, in this modification 1061, the connecting sheet 28 includes a stress relaxing portion. More specifically, as shown in FIG. 13B, the circuit layer 30 of the connecting sheet 28 includes stress relaxing holes 34 as the stress relaxing portion in this modification 1061. The stress relaxing holes 34 are provided in the circuit layer 30 located at the portion of the substrate sheet 29, which corresponds to the portion between the solar cell elements 2. The stress relaxing hole 34 has a shape to be bent relative to the long side direction of the solar cell string 16 in plan view. In this case, when bending in the long side direction, the solar cell module 106 is reinforced against expansion and contraction toward the long side direction by the circuit layer 30 described above. In addition, a stress is relaxed at the portion of the solar cell string 16, which is located between the solar cell elements 2, by the stress relaxing holes 34. As a result, this can reduce a breaking of wire of the connecting sheet 28.

Figure 13B:
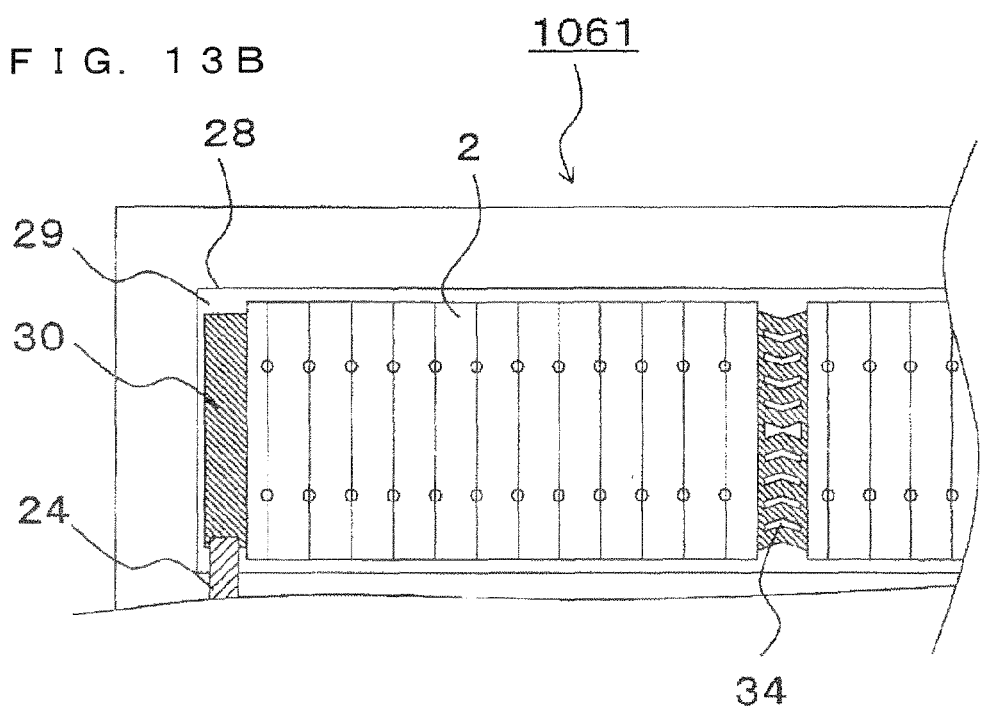
FIG. 13B is a partially enlarged plan view showing a modification of the solar cell string used in the solar cell module according to the sixth embodiment.

As shown in FIG. 13B, the stress relaxing holes 34 may be provided to be linearly symmetric to the central axis parallel to the long side direction of the solar cell string 16. In this case, the bias of the stress exerted on the solar cell string 16 can be preferably reduced.

In a case where the connecting sheet 28 is a layered body asymmetric to the central axis parallel to one main surface in the thickness direction thereof, the connecting sheet 28 may be formed by attaching the substrate sheet 29 and the circuit layer 30 at a temperature close to the preheating temperature of a laminator, for example, at 40° C. to 70° C. As a result, this can reduce the displacement of the contact portion 30a and the output extraction electrode 27 due to warps of the connecting sheet 28 occurred by preheating on the laminator before components of the solar cell module 106 are sufficiently heated and pressurized to be integrated by the laminator. That is, the connecting sheet 28 can be kept to be horizontal when the preheat of the laminator is applied to the connecting sheet 28. The connecting sheet 28 may be a layered body that is disposed to be substantially symmetric to the central axis in the thickness direction thereof.

The embodiments of the solar cell module according to the present invention have been shown and described. Needless to say, the present invention is not limited to the embodiments described above, which may be any embodiment without deviating from the intention of the present invention.

For example, while the first embodiment has described the division method through irradiation of laser light from the light-receiving surface as the method of forming the solar cell element 201, the other division method through irradiation of laser light from the non-light-receiving surface side may be used.

Method of Manufacturing Solar Cell Module

Seventh Embodiment

The method of manufacturing a solar cell module according to a seventh embodiment of the present invention is described below in detail with reference to FIGS. 14A to 14C and 16A to 19C.

The solar cell module 101 described above can be manufactured by a method of manufacturing a solar cell module according to the present embodiment. Specifically, a method of manufacturing a solar cell module according to the present embodiment includes a first step and a second step. In the first step, a plurality of solar cell element assemblies including a plurality of solar cell elements 2, each of which includes a silicon substrate with a first main surface and a second main surface on the opposite side to the first main surface, are arranged in one direction, and the corresponding solar cell elements are connected in one direction by a plurality of interconnection materials, to thereby form an assembly of a plurality of solar cell strings. In the second step, the boundaries between the adjacent solar cell elements of the solar cell element assemblies are irradiated with laser light along one direction from the second main surface side, and each of the assemblies is divided into individual solar cell elements by a thermal stress, to thereby form a plurality of solar cell strings each including a plurality of solar cell elements connected in one direction by the interconnection materials.

Next, the members used in this manufacturing method are described in detail with reference to the drawings.

Figure 14A:
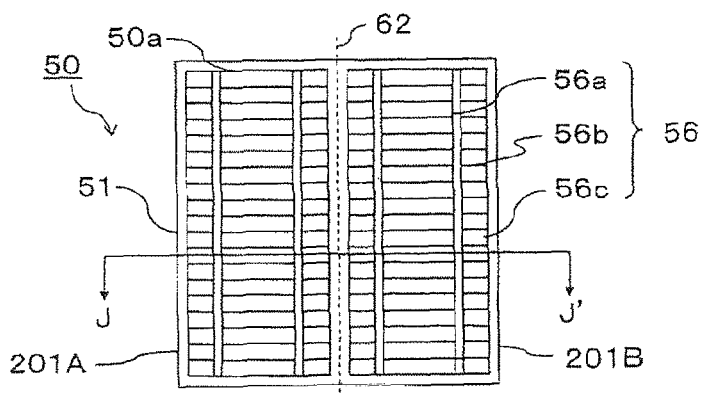
FIGS. 14A to 14C show a solar cell element assembly used in a method of manufacturing a solar cell module according to a seventh embodiment of the present invention, where
Figure 14B:
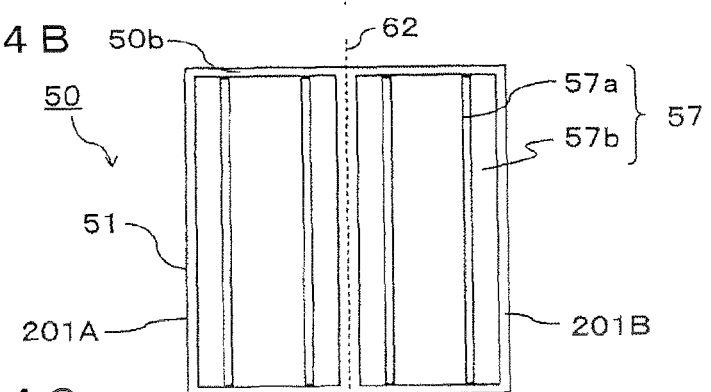
Figure 14C:
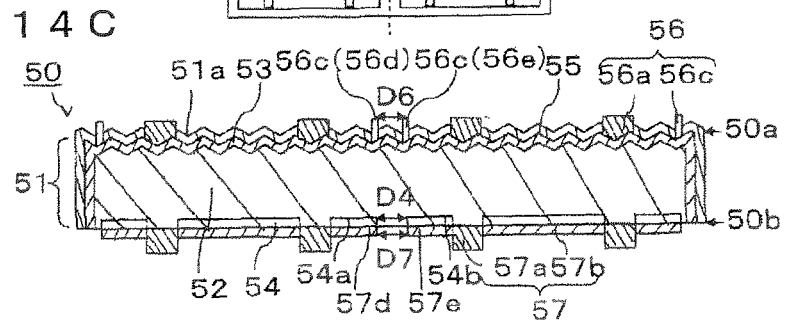

First, a solar cell element assembly 50 used in the manufacturing method according to the present embodiment is described. As shown in FIGS. 14A to 14C, the solar cell element assembly 50 used in the method of manufacturing a solar cell element according to the present embodiment includes a light-receiving surface (upper surface in FIG. 14C, which is referred to as a first main surface below) 50a upon which light is incident and a non-light-receiving surface (lower surface in FIG. 14C, which is referred to as a second main surface below) 50b that is the surface (back surface) on the opposite side of the first main surface 50a. In addition, the solar cell element assembly 50 includes a plate-like silicon substrate 51, first electrodes 56 provided on the first main surface 50a side, and second electrodes 57 provided on the second main surface 50b side. As shown in FIG. 14C, the silicon substrate 51 includes a first semiconductor layer 52 being a semiconductor layer of one conductivity type and a second semiconductor layer 53 being a semiconductor layer of an opposite conductivity type that is provided on the first main surface 50a side in the first semiconductor layer 52.

The structure of the solar cell element assembly 50 is described below more specifically with reference to FIGS. 14A to 14C.

A silicon substrate similar to the silicon substrate 3 in the solar cell element 201 according to the first embodiment described above can be used as the silicon substrate 51 including the first semiconductor layer 52 of one conductivity type (for example, p type).

Description is given below of the example in which a crystalline silicon substrate having a p-type conductivity is used as the silicon substrate 51.

The second semiconductor layer (opposite conductivity type layer) 53 that forms a pn junction with the first semiconductor layer 52 is a layer having a conductivity type opposite to that of the first semiconductor layer 52 (silicon substrate 51), and is provided on the first main surface 50a side in the first semiconductor layer 52.

An anti-reflection layer (insulating layer) 55 is formed on the first main surface 50a side of the silicon substrate 51. For example, a silicon nitride film, titanium oxide film, silicon oxide film or the like can be used as the anti-reflection layer 55. The thickness of the anti-reflection layer 55 is appropriately selected depending on a material, which may be a thickness sufficient for achieving a non-reflective condition for appropriate incident light. In a case where the anti-reflection layer 55 is comprised of a silicon nitride film, a passivation effect can also be achieved.

A third semiconductor layer 54 has the same conductivity type as that of the first semiconductor layer 52. The concentration of a dopant contained in the third semiconductor layer 54 is higher than the concentration of a dopant contained in the first semiconductor layer 52. That is, the third semiconductor layer 54 contains a dopant element at a higher concentration than the concentration of a dopant element that is doped for showing one conductivity type in the first semiconductor layer 52. The third semiconductor layer 54 serves to reduce a reduction in power generation efficiency due to the recombination of carriers near the second main surface 50b in the silicon substrate 51. The third semiconductor layer 54 forms an internal electric field on the second main surface 50b side in the silicon substrate 51. In the case where the silicon substrate 51 has a p-type, the third semiconductor layer 54 can be formed by, for example, diffusing a dopant element such as boron or aluminum into the second main surface 50b side. In this case, the concentration of the dopant element contained in the third semiconductor layer 54 is approximately $1 \times 10^{18}$ to $5 \times 10^{21}$ atoms/cm$^3$.

As shown in FIG. 14A, the first electrode 56 includes a first output extraction electrode (first bus bar electrode) 56a and a plurality of linear first finger electrodes 56b. At least a part of the first output extraction electrode 56a intersects the first finger electrodes 56b. The first electrode 56 has a thickness of, for example, approximately 10 to 40 μm.

A plurality of lines (four lines in FIG. 14A) of the first output extraction electrodes 56a are formed in the direction (first direction) parallel to the arrangement direction of the solar cell elements 201 in a case where the solar cell module 101 is formed. The first output extraction electrode 56a has a width of, for example, approximately 1.3 to 2.5 mm in the short side direction.

Meanwhile, the first finger electrode 56b has a linear shape. The first finger electrode 56b has, for example, a width of approximately 50 to 200 μm in the short side direction, which is smaller than the width of the first output extraction electrode 56a. The plurality of first finger electrodes 56b are provided at intervals of approximately 1.5 to 3 mm along the direction (second direction) which intersects the arrangement direction of the solar cell elements 201, for example, along the direction (second direction) perpendicular to the arrangement direction, and one end of each thereof is connected to the first output extraction electrode 56a.

The first electrode 56 as described above can be formed by, for example, applying a conductive paste mainly containing silver into a desired shape through screen printing or the like, and then, firing the applied conductive paste.

Alternatively, the first electrode 56 may include a first auxiliary electrode 56c extending in parallel with the arrangement direction of the solar cell elements 201. Each first auxiliary electrode 56c intersects an end portion of the first finger electrode 56b in the second direction. This enables to move, even when breaking of wire occurs in which part of the first finger electrode 56b breaks, the carriers collected in the first finger electrodes 56b where breaking of wire has occurred up to the first output extraction electrode 56a through the other first finger electrode 56b by means of the first auxiliary electrode 56c. The width in the short side direction of the first auxiliary electrode 56c can be made equal to the width in the short side direction of the first finger electrode 56b.

The second electrode 57 includes a second output extraction electrode (second bus bar electrode) 57a and a second current collector electrode 57b. The second output extraction electrode 57a has, for example, a thickness of approximately 10 to 30 μm and a width of approximately 1.3 to 7 mm in the short side direction.

In the case where the solar cell module 101 is formed, a plurality of (four lines in FIG. 14C) second output extraction electrodes 57a are formed in the direction (first direction) parallel to the arrangement direction of the solar cell elements 201. The second output extraction electrode 57a can be formed by, for example, applying a conductive paste mainly containing silver into a desired shape through screen printing or the like, and then, firing the applied conductive paste.

Meanwhile, the second current collector electrode 57b is formed over the substantially entire surface of the second main surface 50b in the silicon substrate 51 except for a part of the second output extraction electrode 57a, a boundary (imaginary dividing line) 62 described below, and a vicinity thereof. The second current collector electrode 57b has a thickness of, for example, approximately 15 to 50 μm. The second current collector electrode 57b can be formed by, for example, applying an aluminum paste into a desired shape through screen printing or the like, and then, firing the applied aluminum paste.

The structure of the solar cell element assembly 50 used in the manufacturing method according to the present embodiment is not limited to the above-mentioned structure. For example, the solar cell element assembly 50 having other structure shown in FIGS. 15A to 15C may be used. The other structure of the solar cell element assembly 50 is described with reference to FIGS. 15A to 15C. Components similar to those of FIGS. 14A to 14C are not described here.

Figure 15A:
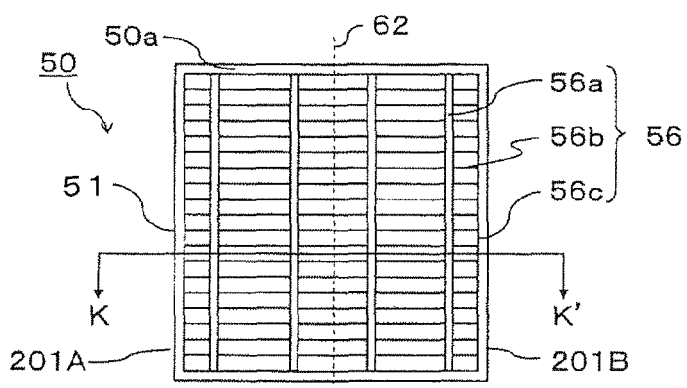
FIGS. 15A to 15C show another example of the solar cell element assembly used in the method of manufacturing a solar cell module according to the seventh embodiment of the present invention, where
Figure 15B:
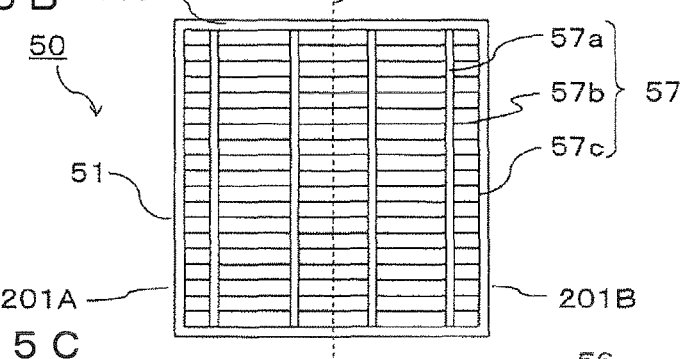

In this structure, the second electrode 57 may have a similar shape to, for example, that of the first electrode 56. That is, as shown in FIG. 15B, the second electrode 57 includes a second output extraction electrode 57a, a plurality of linear second finger electrodes 57b, and a linear second auxiliary electrode 57c intersecting an end portion in the long side direction of the second finger electrode 57b. The second output extraction electrode 57a, the second finger electrode 57b, and the second auxiliary electrode 57c may have widths in the short side direction larger than the widths in the short side direction of the first output extraction electrode 56a, the first finger electrode 56b, and first auxiliary electrode 56c, respectively. The above-mentioned second electrode 57 can be formed by, for example, applying a conductive paste mainly containing silver into a desired shape through screen printing or the like, and then, firing the applied conductive paste.

Figure 15C:
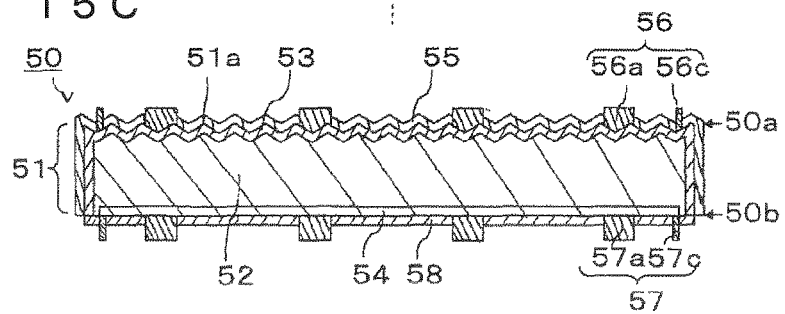

In this structure, the solar cell element assembly 50 further includes a passivation layer 58. The passivation layer 58 is formed on the second main surface 50b side of the silicon substrate 51. The passivation layer 58 serves to reduce the recombination of carriers near the second main surface 50b in the silicon substrate 51. For example, a silicon nitride, Si nitride film such as an amorphous Si nitride film, a silicon oxide film, an aluminum oxide film, a titanium oxide film or the like can be used as the passivation layer 58. The passivation layer 58 may have a thickness of approximately 100 to 2,000 Å. The passivation layer 58 described above is not necessarily required to have the configuration in the present embodiment, as shown in FIGS. 15A to 15C, but may be formed as required.

Figure 16A:
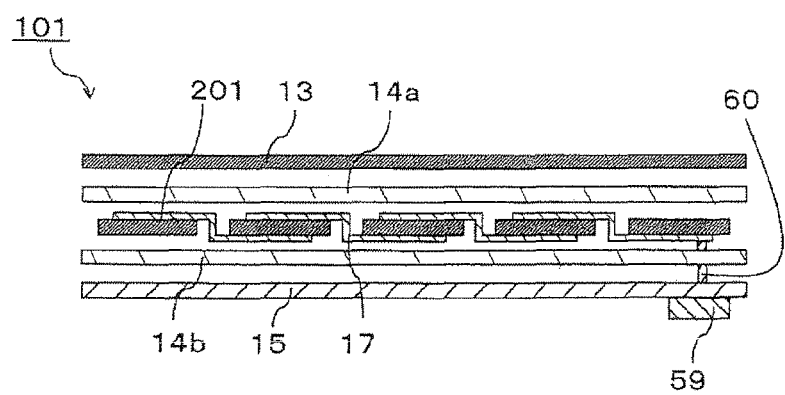
FIGS. 16A and 16B show the solar cell module manufactured by the method of manufacturing a solar cell module according to the seventh embodiment of the present invention, where
Figure 16B:
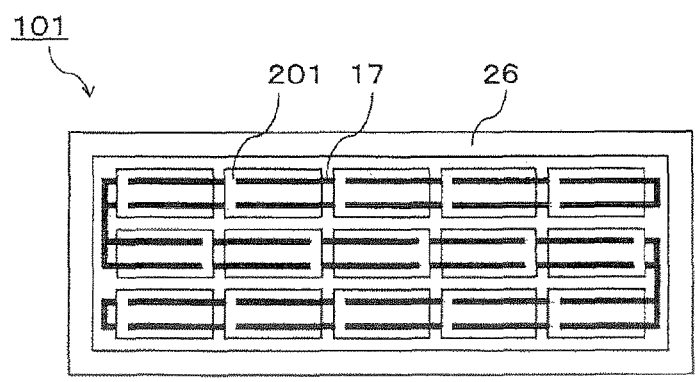

Second, the solar cell module 101 manufactured by the manufacturing method according to the present embodiment is described. As shown in FIGS. 16A and 16B, the solar cell module 101 manufactured by the manufacturing method according to the present embodiment includes a plurality of solar cell elements 201 connected in series and in parallel. The combination of a plurality of solar cell modules 101 described above enables extraction of practical electric output.

The solar cell module 101 includes a plurality of solar cell elements 201 arranged adjacent to each other and the inner lead 17 electrically connecting the adjacent solar cell elements 201.

As shown in FIG. 16A, the solar cell module 101 includes the light-transmitting member 13, the light-receiving-surface-side sealing material 14a, the non-light-receiving-surface-side sealing material 14b, and the non-light-receiving-surface-side protective material 15.

The light-transmitting member 13, the light-receiving-surface-side sealing material 14a, the non-light-receiving-surface-side sealing material 14b, and the non-light-receiving-surface-side protective material 15 respectively have functions specifically described in the first embodiment, and are formed of various materials.

As shown in FIG. 16A, as to the plurality of solar cell elements 201, the first output extraction electrode 56a of one of the adjacent solar cell elements 201 and the second output extraction electrode 57a of the other of the adjacent solar cell elements 201 are connected by means of the elongated (linear) inner leads 17.

As in the first embodiment above, a metal member such as copper is used as the inner lead 17. For example, a member obtained by cutting a belt-like copper foil entirely covered with a solder material into a predetermined length in the long side direction thereof can be used as the inner lead 17. The inner lead 17 may have, for example, a thickness of approximately 0.1 to 0.4 mm and a width of approximately 2 mm.

One end of the first solar cell element 201 and one end of the last solar cell element 201 among the plurality of solar cell elements 201 connected in series are connected to a terminal box 59 being an output extraction portion by means of an output extraction interconnection 60. Though not shown in FIG. 16A, as shown in FIG. 16B, the solar cell module 101 may include the frame 26 comprised of aluminum or the like.

<Method of Manufacturing Solar Cell Element Assembly 50>

Next, the method of manufacturing the solar cell element assembly 50 having the above-mentioned structure is described.

First, the method of manufacturing the silicon substrate 51 including the first semiconductor layer 52 is described. In a case where the silicon substrate 51 is a monocrystalline silicon substrate, the silicon substrate 51 is formed by, for example, Czochralski method. In a case where the silicon substrate 51 is a polycrystalline silicon substrate, the silicon substrate 51 is formed by, for example, casting. Description is given below of an example in which p-type polycrystalline silicon is used.

First, an ingot of polycrystalline silicon is produced by, for example, casting. Then, the ingot is sliced to have a thickness of, for example, 250 μm or smaller. After that, the surface of the silicon substrate 51 is slightly etched with NaOH, KOH, hydrofluoric acid, nitric acid, or the like for cleaning a mechanically damaged layer or a contaminated layer on the cut surface of the silicon substrate 51. After the etching step, a minute concavo-convex structure 51a is formed on the surface of the silicon substrate 51 by wet etching or dray etching.

Next, the n-type second semiconductor layer 53 is formed in the surface layer on the first main surface 50a side of the silicon substrate 51. The second semiconductor layer 53 described above is formed by, for example, an application and thermal diffusion method in which paste-like $P_2O_5$ is applied onto the surface of the silicon substrate 51 and is thermally diffused, a vapor phase thermal diffusion method in which gaseous $POCl_3$ (phosphorous oxychloride) is a diffusion source, or ion implantation method in which phosphorous ion is diffused directly. The second semiconductor layer 53 is formed to have a thickness of approximately 0.2 to 2 μm and a sheet resistance of approximately 40 to 200Ω/□.

Next, in a case where the second semiconductor layer 53 is formed not only on the first main surface 50a side but also on the second main surface 50b side in the above-mentioned step, only the second semiconductor layer 53 on the second main surface 50b side is removed through etching. As a result, a p-type conductivity region is exposed on the second main surface 50b side. The second semiconductor layer 53 on the second main surface 50b side can be removed by, for example, dipping only the second main surface 50b side of the silicon substrate 51 into a hydrofluoric acid solution. Alternatively, the silicon substrate 51 having a similar structure can also be formed by forming a diffusion mask on the second main surface 50b side in advance, forming the second semiconductor layer 53 by, for example, the vapor phase thermal diffusion method, and then, removing the diffusion mask.

Through the above, the silicon substrate 51 including the first semiconductor layer 52 that includes a p-type semiconductor layer and the second semiconductor layer 53 that includes an n-type semiconductor layer can be prepared. Note that the method of forming the second semiconductor layer 53 is not limited to the above-mentioned method. Alternatively, using a thin film technique, a hydrogenated amorphous silicon film, a crystalline silicon film including a microcrystalline silicon film, or the like may be formed as the second semiconductor layer 53. Additionally, in the silicon substrate 51, an i-type silicon region may be formed between the first semiconductor layer 52 (silicon substrate 51) and the second semiconductor layer 53.

Next, the anti-reflection layer (insulating layer) 55 is formed on the first main surface 50a side of the silicon substrate 51 prepared as described above. The anti-reflection layer 55 is formed by, for example, a plasma enhanced chemical vapor deposition (PECVD) method, a vapor deposition method, a sputtering method or the like. For example, in a case where the anti-reflection layer 55 formed of a nitride silicon film is formed by the PECVD process, the interior of the reaction chamber is set to approximately 500° C., and a gaseous mixture of silane ($SiH_4$) and ammonia ($NH_3$) diluted with nitrogen ($N_2$) is plasmatized and deposited by glow discharge decomposition, to thereby form the anti-reflection layer 55.

Next, the third semiconductor layer 54 in which impurities of one conductivity type are highly diffused is formed on the second main surface 50b side of the silicon substrate 51. The following two methods are employable as the method of forming the third semiconductor layer 54. In the first method, the third semiconductor layer 54 is formed at a temperature of 800 to 1,100° C. by the thermal diffusion method in which boron tribromide ($BBr_3$) is used as a diffusion source. In the second method, an aluminum paste comprising of powdered aluminum, organic vehicle, and the like is applied through printing, and is then heat-treated (fired) at a temperature of approximately 600 to 850° C., to thereby diffuse aluminum into the silicon substrate 51. With the use of the second method, a desired diffusion region can be formed only on a printing surface. Besides, it is not required to remove the second semiconductor layer 53 of n-type formed on the second main surface 50b side in the same step as that of forming the second semiconductor layer 53. Accordingly, in this method, it is sufficient that pn isolation is performed on only the outer perimeter on the first main surface 50a side or the second main surface 50b side with laser light or the like for reducing a leakage failure due to the contact between the second semiconductor layer 53 and the third semiconductor layer 54.

Next, the passivation layer 58 is formed as required. The PECVD method, a vapor deposition method, a sputtering method or the like may be used as the method of forming the passivation layer 58. In the case of forming the passivation layer 58, a mask may be provided on the region of the second main surface 50b except for the portion at which the passivation layer 58 is to be formed, or a passivation layer may be provided over the entire second main surface 50b and then removing the region other than the portion at which the passivation layer 58 is to be formed.

Next, the first electrode 56 (first output extraction electrode 56a and first finger electrodes 56b) and the second electrode 57 (second output extraction electrode 57a and second current collector electrode 57b) are formed as follows.

First, the first electrode 56 is described. The first electrode 56 is produced with, for example, a conductive paste containing powdered metal such as silver (Ag), an organic vehicle, and a glass frit. This conductive paste is applied onto the first main surface 50a of the silicon substrate 51, and then, is fired at a maximum temperature of 600 to 850° C. for approximately tens of seconds to tens of minutes, to thereby form the first electrode 56. For example, screen printing can be used as the application method, and after the application, a solvent may be evaporated and dried at a predetermined temperature.

Next, the second electrode 57 is described. In the solar cell element assembly 50 having the structure shown in FIGS. 14A to 14C, first, the second current collector electrode 57b is produced with an aluminum paste containing powdered aluminum and an organic vehicle. This paste is applied onto the almost entire second main surface 50b of the silicon substrate 51, except for a part of a portion in which the second output extraction electrode 57a is to be formed and a division region in the second main surface 50b. Screen printing or the like may be used as the application method. After the application of a paste in this manner, the solvent may be evaporated and dried at a predetermined temperature. In this case, a paste is unlikely to adhere to a portion other than a portion at which the second electrode 57 is to be formed during work. The division region herein refers to a region including the boundary (imaginary dividing line) 62 described below. More specifically, as shown in, for example, FIG. 14C, the division region is a region of the second main surface 50b, which corresponds to a first distance D7 described below.

Next, the second output extraction electrode 57a is produced with a conductive paste containing powdered metal such as powdered silver, an organic vehicle, and a glass frit. This conductive paste is applied into a predetermined shape. Upon application of the conductive paste at such a position to come into contact with a part of the aluminum paste, a part of the second output extraction electrode 57a and a part of the second current collector electrode 57b overlap each other. For example, screen printing can be used as the application method and, after the application, the solvent is preferably evaporated and dried at a predetermined temperature.

In the solar cell element assembly 50 having the structure shown in FIGS. 15A to 15C, the second electrode 57 is produced with, for example, a conductive paste containing powdered metal such as silver (Ag), an organic vehicle, and a glass frit. This conductive paste is applied onto the second main surface 50b of the silicon substrate 51, and then, is fired at a maximum temperature of 600 to 850° C. for approximately tens of seconds to tens of minutes, to thereby form the second electrode 57. For example, screen printing can be used as the application method and, after the application, the solvent is preferably evaporated and dried at a predetermined temperature.

Then, the silicon substrate 51 is fired at a maximum temperature of 600 to 850° C. for approximately tens of seconds to tens of minutes in a firing furnace, whereby the second electrode 57 is formed on the second main surface 50 of the silicon substrate 51.

While the formation of electrodes by printing and firing has been used above, electrodes can be formed by the formation of a thin film through vapor deposition, sputtering, or the like, or plating.

As described above, the large solar cell element assembly 50 including a plurality of solar cell elements (two solar cell elements in FIGS. 14A to 14C and 15A to 15C) 201 can be manufactured.

<Method of Manufacturing Solar Cell Module>

Next, description is given of the method of manufacturing a solar cell module according to the present embodiment with the use of the solar cell element assembly 50 obtained as described above.

As described above, the manufacturing method according to the present embodiment includes the first step and the second step. Each step is described below in detail.

Figures 17A, 17B, 17C:
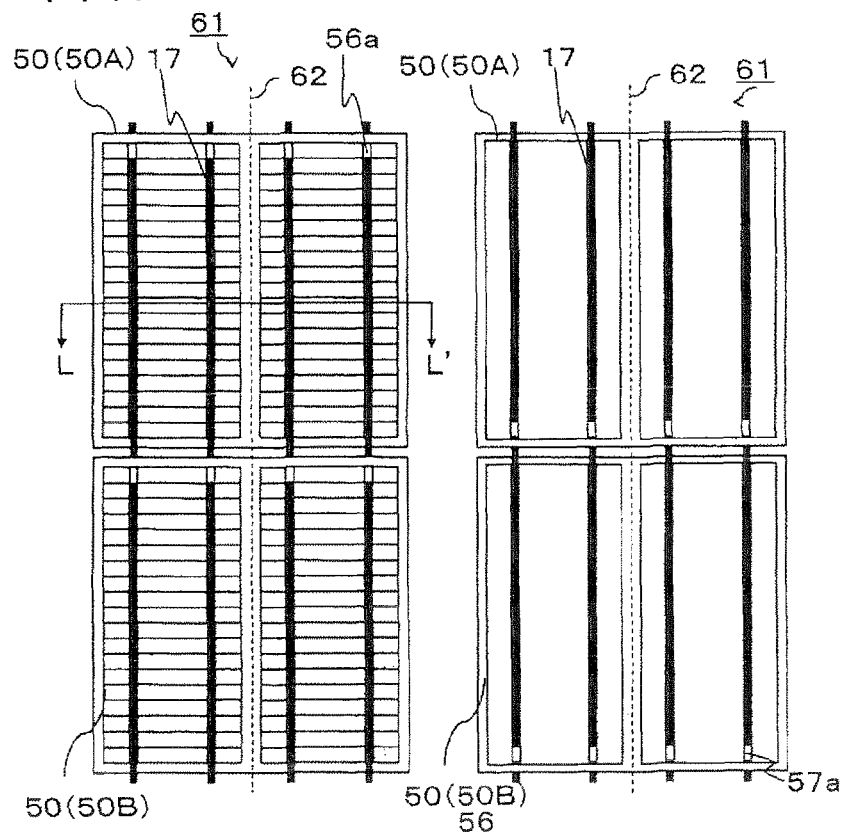
FIGS. 17A to 17C show a part of an assembly of a plurality of solar cell strings used in the method of manufacturing a solar cell module according to the seventh embodiment of the present invention, where

As shown in FIGS. 17A to 17C, in the first step, a plurality of solar cell element assemblies 50 are connected to each other by means of the inner leads 17 to form an assembly of strings 61. One end of one inner lead 17 is connected to the first output extraction electrode 56a of the solar cell element assembly 50 (50A), and the other end thereof is connected to the second output extraction electrode 57a of the adjacent solar cell element assembly 50 (50B). As a result, the inner leads 17 connect the two adjacent solar cell element assemblies 50. The one-end-side portion of the inner lead 17 is connected to the first extraction electrode 56a along the arrangement direction of the first output extraction electrode 56a, and the other-end-side portion of the inner lead 17 is connected to the second extraction electrode 57a along the arrangement direction of the second output extraction electrode 57a.

In the mode shown in FIGS. 17A to 17C, the solar cell element assembly 50 shown in FIGS. 14A to 14C is used. Therefore, the solar cell element assembly 50 includes two solar cell elements 201A and 201B. The solar cell element assembly 50 includes four first output extraction electrodes 56a on the first main surface 50a side and four second output extraction electrodes 57a on the second main surface 50b side. The solar cell element assembly 50 (50A) has the configuration as described above, and thus, the adjacent solar cell element assembly 50 (50B) is connected by four inner leads 17 correspondingly to the respective output extraction electrodes.

As described above, a lead coated with a solder material or a lead formed of a metal foil can be used as the inner lead 17. As the method of connecting the inner leads 17, in a case of the inner lead 17 coated with a solder material, the inner leads 17 may be connected by being soldered to the first output extraction electrodes 56a and the second output extraction electrodes 57a of the solar cell element assembly 50, with the use of hot air, a soldering iron, or the like, or in a reflow oven. Alternatively, in a case where the inner lead 17 is formed of a metal foil, the inner leads 17 may be connected to electrodes with a cold cure conductive adhesive. For example, the inner leads 17 are brought into contact with the first output extraction electrodes 56a and the second output extraction electrodes 57a via the conductive adhesive, and then, are heat-treated at approximately 150 to 250° C. Accordingly, the inner leads 17 can be connected to the first output extraction electrodes 56a, and the second output extraction electrodes 57a. For example, a conductive filler of silver, nickel, carbon, or the like, which includes an epoxy resin, silicon resin, polyimide resin, polyurethane resin, or the like as a binder, can be used as the conductive adhesive.

Figure 18:
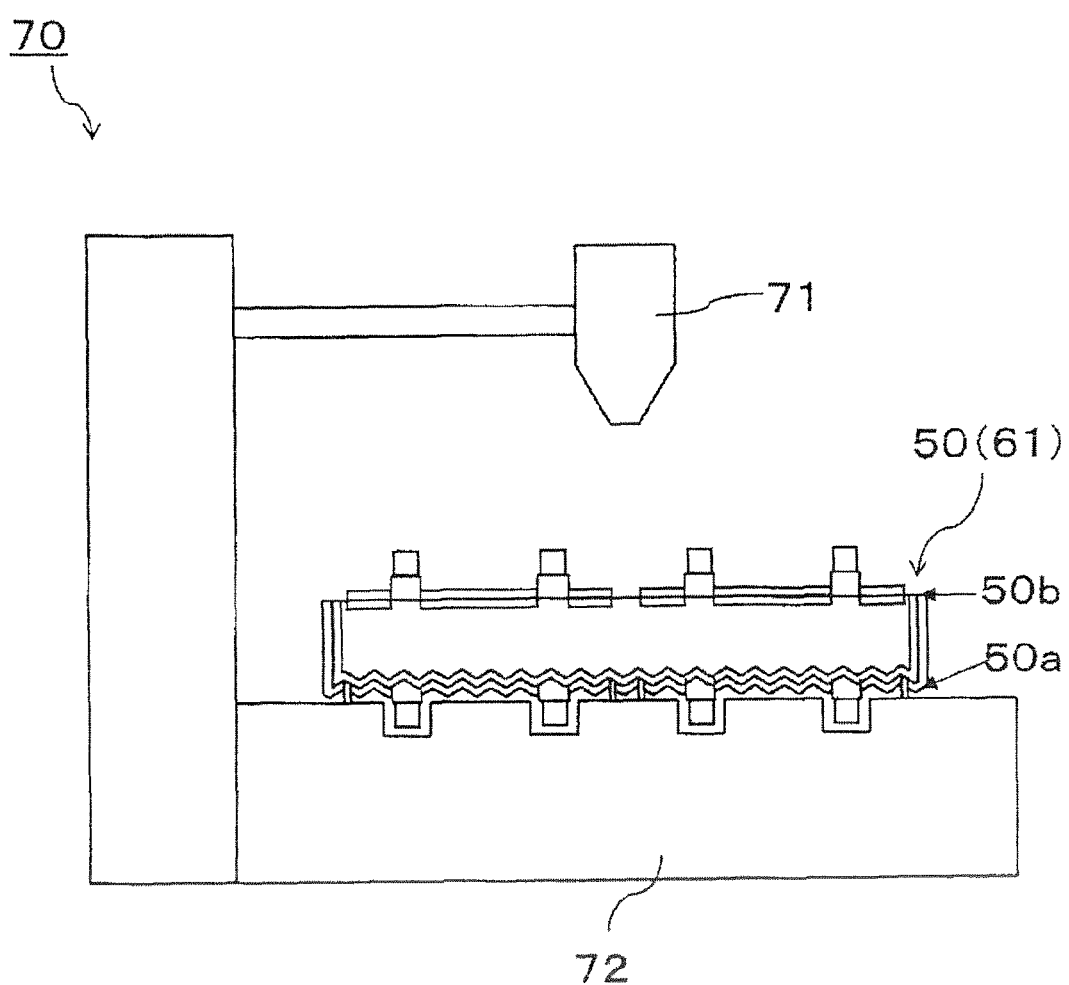
FIG. 18 is a schematic view showing an example of a laser system used in the method of manufacturing a solar cell module according to the seventh embodiment of the present invention.

Next, in the second step, as shown in FIG. 18, the assembly of strings 61 obtained as described above is mounted on a table 72 of a laser system 70, and is adjusted such that a laser irradiation part 71 is located just above the boundary (imaginary dividing line) 62. Then, the boundary 62 is irradiated with laser light on the condition that heating is produced locally to such an extent that the solar cell element assembly 50 does not evaporate. Then, the assembly of strings 61 is divided into the individual solar cell elements 201 by a thermal stress produced by the irradiation of laser light. That is, the second step includes a laser irradiation step and a division step.

As described above, with the use of the assembly of strings 61, the solar cell element assembly 50 is irradiated with laser light along the boundary (imaginary dividing line) 62 parallel to the arrangement direction of the solar cell element assemblies 50. Accordingly, a minute crack can be produced with the use of a thermal stress due to a compression stress acting around the irradiation position and a tensile stress acting on the vicinity of the irradiation position. Then, the crack is guided in the direction along the boundary (imaginary dividing line) 62 with the use of the thermal stress by laser light, so that the solar cell element assembly 50 is divided. As a result, as shown in FIGS. 19A to 19C, the solar cell string 16 including the plurality of solar cell elements 201 connected to each other is formed. In this case, laser light is radiated in the state in which the first main surfaces 50a and second main surfaces 50b of the plurality of solar cell element assemblies 50 are connected with the plurality of inner leads 17, which reduces warpage in the direction parallel to the arrangement direction of the solar cell element assemblies 50 in a laser irradiation target. This reduces defocusing of laser light, and thus, a decrease of yield in the step of dividing the solar cell element assembly 50 (second step) can be reduced.

According to the manufacturing method of the present embodiment, the solar cell element assembly 50 can be divided through one step of dividing the solar cell element assembly 50 through laser irradiation, differently from the manufacturing method including two steps including the step of evaporating a part of the solar cell element assembly 50 through laser irradiation to form a dividing groove, and the step of dividing the solar cell element assembly 50 through application of an external force thereon after the above-mentioned step. Accordingly, productivity can be improved in the present embodiment.

The solar cell element 201 obtained through the above-mentioned division can be preferably used in a small solar cell module and the like. For example, the small solar cell module described above is installed in relatively small devices such as chargers for electronic equipment and cellular phones for use. According to the manufacturing method of the present embodiment, as described above, a solar cell element having a desired size can be manufactured with high efficiency by manufacturing a large solar cell element (solar cell element assembly) and dividing that into a required size. This means that the machine and equipment tailored to the size of a substrate of each solar cell element are not required, accordingly this leads to an increase in the efficiency of manufacturing various solar cell elements having different sizes.

Also, Japanese Patent Application Laid-Open No. 2005-236017 discloses the method of irradiating the solar cell element with laser light from the non-light-receiving surface (second main surface) side to form a dividing groove, and exerting an external force on the dividing groove, to thereby divide the solar cell element. In this dividing method, in a case where a dividing groove having a depth sufficient for division is not formed, at times, the solar cell element is not divided along the dividing groove even when an external force is exerted on the dividing groove, division is poorly performed, and the divided solar cell element cannot be used. This may reduce a yield. According to the manufacturing method of the present embodiment, however, a solar cell element is divided by a thermal stress after laser irradiation, which can suppress a reduction in yield in the step of dividing a solar cell element.

In the manufacturing method according to the present embodiment, in the case of scanning with laser light, the laser irradiation part 71 may be moved in a predetermined direction, or the table 72 may be moved in a predetermined direction. Alternatively, both of the laser irradiation part 71 and the table 72 may be moved in a predetermined direction.

According to the manufacturing method of the present embodiment, a pn junction region is formed in the first main surface 50 before the first step. Accordingly, according to this manufacturing method, the surface on the opposite side to the surface in which a junction region (pn junction) is formed in the solar cell element assembly 50 can be irradiated with laser light. In other words, in the solar cell element assembly 50 in which a junction region is formed in the first main surface 50a, the second main surface 50b side can be irradiated with laser light. As a result, a junction region (pn junction) is not formed at the boundary (imaginary dividing line) 62 on the surface irradiated with laser light, which enables to reduce damage to the junction region due to laser irradiation.

As shown in FIGS. 15A to 15C, the linear first finger electrodes 56b or second finger electrodes 57b may be formed at the boundary (imaginary dividing line) 62 of the adjacent solar cell elements 201A and 201B in the solar cell element assembly 50. Alternatively, as shown in FIGS. 14A to 14C, the first electrodes 56 or the second electrodes 57 may be formed to have a plurality of regions at predetermined intervals in the solar cell element assembly 50.

That is, as shown in FIGS. 14B and 14C, the manufacturing method according to the present embodiment further includes the step of forming the second electrode 57 on the second main surface 50b before the second step and, in this formation step, the second electrode 57 is formed to include the first region 57d and the second region 57e that is disposed with the first distance D7 from the first region 57d in the direction perpendicular to the arrangement direction of the solar cell element assemblies 50. This first distance D7 corresponds to the boundary (imaginary dividing line) 62. Then, in the division step (second step), the solar cell element assembly 50 is divided into the individual solar cell elements 201 at the position in the first distance D7.

Accordingly, the silicon substrate 51 is irradiated with laser light directly without involving the second electrode 57, which enables to produce a crack easily.

As shown in FIG. 14B, in the case where the second current collector electrode 57b is not located at the boundary (imaginary dividing line) 62 and in the vicinity thereof, that is, in the case where the second current collector electrode 57b is formed with a predetermined distance from the boundary (imaginary dividing line) 62, the second current collector electrode 57b may be formed of aluminum. The above-mentioned case enables to reduce a problem that the second current collector electrode 57b melted through irradiation with laser light is cooled and solidified, and accordingly, the division of the solar cell element assembly 50 is interfered.

The same holds true for the first electrode 56. That is, as shown in FIGS. 14A and 14C, the manufacturing method according to the present embodiment further includes the step of forming the first electrode 56 on the first main surface 50a before the second step and, in this formation step, the first electrode 56 is formed to include a fifth region 56d and a sixth region 56e. In this case, the fifth region 56d and the sixth region 56e are disposed with a second distance D6 therebetween, and the second distance D6 corresponds to the boundary (imaginary dividing line) 62. Then, in the division step (second step), the solar cell element assembly 50 is divided into the individual solar cell elements 201 at a position in the second distance D6.

As a result, in a case where laser light is radiated from the second main surface 50b side, a problem of poor division, such as partial breaking of the first electrode 56, can be reduced. This enables to extend the range of the irradiation conditions of laser light, and productivity can be improved further.

The second distance D6 is equal to or larger than the first distance D7, which enables to reduce an overlap between the division position and the first electrode 56 even if the solar cell element assembly 50 is divided slightly obliquely to the desired boundary (imaginary dividing line) 62. In addition, a large light receiving amount can be secured.

As shown in FIG. 14C, the third semiconductor layer 54 is not located at the boundary (imaginary dividing line) 62 and in the vicinity thereof. That is, the manufacturing method according to the present embodiment may further include the step of forming the third semiconductor layer 54 before the second step such that, in this formation step, the third semiconductor layer 54 is provided with a predetermined distance from the boundary (imaginary dividing line) 62. That is, the third semiconductor layer 54 may be formed to include the third region 54a and the fourth region 54b disposed to correspond to the first region 57d and second region 57e of the second electrode 57, respectively. In this case, the third region 54a and the fourth region 54b are disposed with a third distance D4 therebetween, and the portion in this third distance D4 is irradiated with laser light and is divided in the division step (second step). As a result, the silicon substrate 51 is irradiated with laser light without involving the third semiconductor layer 54. This reduces such a problem that due to irradiation with laser light, a dopant of the third semiconductor layer 54 is diffused from the second main surface 50b toward the first main surface 50a and causes a leakage current. The third distance D4 is formed to be equal to or smaller than the first distance D7, and accordingly, the BSF effect can be obtained sufficiently.

The first distance D7, the second distance D6, and the third distance D4 may be, for example, 1 mm or larger and 3 mm or smaller.

Further, the manufacturing method according to the present embodiment may further include the step of forming a pair of first auxiliary electrodes 56c on the first main surface 50a before the second step such that in this formation step, the pair of first auxiliary electrodes 56c extending in parallel to the arrangement direction of the solar cell element assemblies 50 as shown in FIG. 14A are provided at both ends of the boundary (imaginary dividing line) 62. Then, in the division step (second step), a portion located between the pair of first auxiliary electrodes 56c is irradiated with laser light, and the solar cell element assembly 50 is divided. This enables to reduce an occurrence of the crack extending perpendicularly to the arrangement direction of the solar cell element assemblies 50 in division, and reduce degradation of properties due to the breaking of the first finger electrode 56b in the solar cell element 201 obtained after the division.

The laser light that causes light absorption on the surface of the solar cell element assembly 50 can be used as the laser light used in the second step, which may be, for example, a YAG laser, $CO_2$ laser or the like. Alternatively, laser light of continuous oscillation may be used. In this case, a thermal stress is increased, and thus, a crack is easily produced within the silicon substrate 51. For example, the laser spot has a shape such as a circular shape obtained by condensing light with a spherical lens or a linear shape obtained by condensing light with a cylindrical lens. In the case where a laser spot has a linear shape, scanning with laser light may be performed such that the scanning direction coincides with the long side direction thereof.

Laser light is radiated by appropriately adjusting the scanning speed, laser output, laser diameter, and the like in accordance with the thickness of the solar cell element assembly 50 and the type and wavelength of the laser light to be used such that a thermal stress is produced in the solar cell element assembly 50.

In the second step, a gas may be sprayed onto the position of the solar cell element assembly 50 that is irradiated with laser light. In this case, the surface of the solar cell element assembly 50 can be cooled rapidly, and a crack occurs easily within the silicon substrate 51.

The first electrode 56 and the second electrode 57 may be formed such that the ratio of the formation region of the second electrode 57 in the second main surface 50b is larger than the ratio of the formation region of the first electrode 56 in the first main surface 50a. Then, the solar cell element assembly 50 including the first electrode 56 and the second electrode 57 that have the above-mentioned relationship is irradiated with laser light, which enables to easily divide the solar cell element assembly 50.

In the case where the formation region of the first electrode 56 and the formation region of the second electrode 57 have the above-mentioned relationship, as shown in FIG. 20, the solar cell element assembly 50 tends to have a curved shape such that the first main surface 50*a* side thereof is convexed because of the relationship of thermal expansion coefficient. Therefore, when the solar cell element assembly 50 curved as described above is irradiated with laser light, the solar cell element assembly 50 may be irradiated with laser light while a stress is being applied in a direction in which the solar cell element assembly 50 becomes flattened. That is, the manufacturing method according to the present embodiment further includes the step of causing the solar cell element assembly 50 to curve so as to be convexed on the first main surface 50*a* side before the second step. Then, in the second step, the solar cell element assembly 50 is irradiated with laser light while a stress is being applied in a direction in which the solar cell element assembly 50 becomes flattened. Accordingly, a tensile stress acts on the surface of the second main surface 50*b* side, and a crack occurs easily within the silicon substrate 51.

Examples of the method of applying a stress in the direction in which the solar cell element assembly 50 becomes flattened include the method of pressing down the both ends in the arrangement direction of the solar cell element assembly 50 to apply a stress to the solar cell element assembly 50. Alternatively, the method of pressing the solar cell element assembly 50 onto a flat table, and then, flattening the solar cell element assembly 50 through vacuum contact may be used as another method.

Further, the solar cell element assembly 50 may be applied with a stress such that the second main surface 50*b* side of the solar cell element assembly 50 is convexed in the cross-section in the direction perpendicular to the arrangement direction of the solar cell element assembly 50 and irradiated with laser light. This enables to easily divide the solar cell element assembly 50.

Examples of the method of applying a stress to the solar cell element assembly 50 such that the second main surface 50*b* side of the solar cell element assembly 50 is convexed include the method of disposing a spacer at a position of the boundary (imaginary dividing line) 62 on the table 72 on which the solar cell element assembly 50 is mounted, pressing the solar cell element assembly 50 disposed on the spacer such that the first surface 50*a* is opposed to the table 72, to thereby apply a stress on the solar cell element assembly 50. Alternatively, the method of pressing the solar cell element assembly 50 disposed such that the first surface 50*a* is opposed to the table 72 whose center is convexed, and then, causing the second main surface 50*b* side of the solar cell element assembly 50 to be convexed through vacuum contact may be used as another method.

As shown in FIG. 18, on the table 72 on which the assembly of strings 61 is mounted when laser light is radiated, a groove into which the inner lead 17 is housed may be formed at a portion at which the inner lead 17 is located. This enables to reduce variations in height in the thickness direction of the assembly of strings 61 due to the connection of the inner leads 17, and accordingly reducing a misalignment of the target position with laser light.

In the laser irradiation step (second step), the solar cell element assembly 50 may be irradiated with laser light in the atmosphere containing oxygen to be divided. This enables to reduce degradation of properties in the division. It is conceivable that the above may be owing to the passivation effect obtained as a result of the formation of an oxide film in a division region through irradiation with laser light.

The manufacturing method according to the present embodiment may include the step of checking whether or not the solar cell element assemblies 50 in the assembly of solar cell strings 61 have been preferably divided before the individual solar cell strings 16 obtained by dividing the assembly of solar cell strings 61 are transferred. This enables to reduce troubles in transferring solar cell strings.

For example, a light source may be installed in the table 72 and a light recognition device comprised of a camera and the like may be installed above the table 72, in accordance with the division position (boundary) of the solar cell element assembly 50 in the assembly of solar cell strings 61. After irradiation with laser light, light may be radiated from the light source of the table 72 side, and the light coming through the division position may be checked with the light recognition device. Through the above, the state of division of the solar cell element assembly 50 can be checked. In a case where the solar cell element assembly 50 has not been divided, for example, laser light is radiated again to divide the solar cell element assembly 50 that has not been divided, or the assembly of solar cell strings 61 including the solar cell element assembly 50 that has not been divided is transferred to another step to separately divide the solar cell element assembly 50 that has not been divided.

Figure 21:
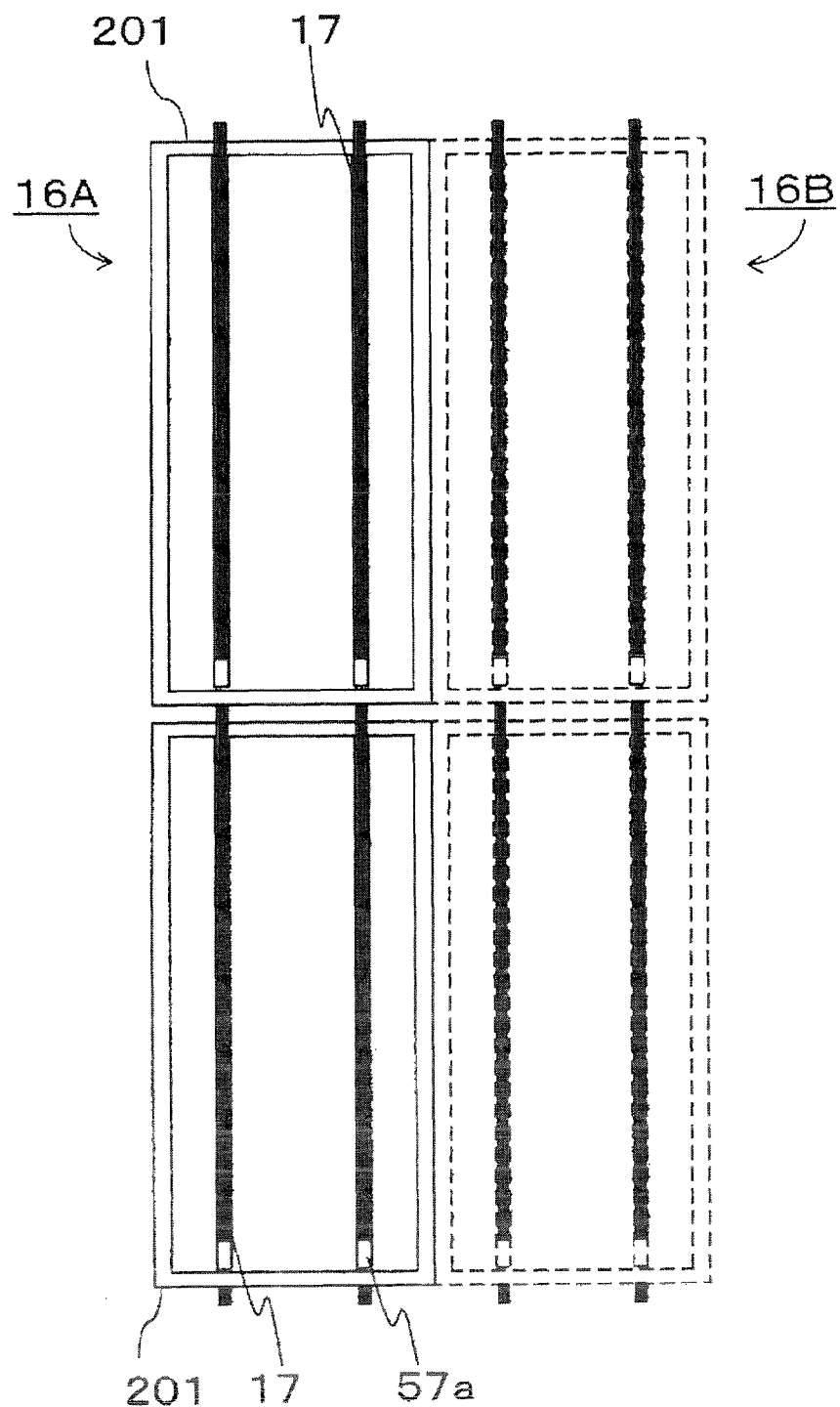
FIG. 21 is a plan view showing a part of the solar cell string used in the method of manufacturing a solar cell module according to the seventh embodiment of the present invention, when viewed from the second main surface side.

The manufacturing method according to the present embodiment further includes a third step of transferring the first solar cell string 16A of the plurality of solar cell strings 16. In this third step, the first solar cell string 16A is lifted up from the table 72 and transferred while the solar cell string 16B except for the first solar cell string 16A are fixed to the table 72. More specifically, in the manufacturing method according to the present embodiment, after the division, the first solar cell string 16A to be transferred may be lifted up from the table 72 and transferred by transfer means while the second solar cell string 16B not to be transferred is fixed onto the table 72 through vacuum contact or the like, as shown in FIG. 21. In this case, even if there is the solar cell element assembly 50 that has not been divided, the above-mentioned method allows a crack to progress, and the divided solar cell strings 16 can be transferred to the following step.

Then, after the formation of the divided solar cell strings 16, for example, the light-receiving-surface-side sealing material 14*a* and the solar cell string 16 including the plurality of solar cell elements 201 connected to each other by means of the inner leads 17 are layered on the light-transmitting member 13 in order and, further thereon, the non-light-receiving-surface-side sealing material 14*b* and the non-light-receiving-surface-side protective material 15 are layered in order. As described above, the respective members are layered and subjected to lamination, whereby the solar cell module 101 in which the respective members are integrated can be formed.

Examples of the lamination in this case include the method of placing a layered body of the above-mentioned members in a laminator, and heating the layered body at a temperature of 100° C. to 200° C. for 15 to 60 minutes while pressurizing the layered body under reduced pressure of 50 to 150 Pa, to thereby melt and crosslink the light-receiving-surface-side sealing material 14*a* and the non-light-receiving-surface-side sealing material 14*b*. As described above, after the lamination, the frame 26 made of aluminum or the like may be fitted around the solar cell module 101 obtained, if necessary.

While the embodiments of the method of manufacturing a solar cell module according to the present invention have been illustrated above, the method of manufacturing a solar cell module according to the present invention is not limited to the above-mentioned embodiments, and numerous modifications and changes can be devised within the scope of the present invention.

For example, the present embodiment has described the mode in which the solar cell element assembly 50 for forming the solar cell element 201 structured to include electrodes on both main surfaces is used. Alternatively, the solar cell element assembly 50 for forming a solar cell element having the metal wrap-through structure or a solar cell element structured to include electrodes only on the second main surface 50*b* side, which is a non-light-receiving surface, may be used, like the solar cell element 205 according to the fifth embodiment.

Further, not one but a plurality of boundaries (imaginary dividing lines) 62 may be provided. That is, one solar cell element assembly 50 may include two or more solar cell elements 201 and may be divided into a plurality of pieces.

Further, while the present embodiment has illustrated a mode in which a separate laser system is used in the laser irradiation step, this laser system may be incorporated into the device that connects the inner leads 17. That is, the laser system is integrated with the connecting device for the inner leads 17. In this case, a table on which the solar cell element assembly 50 is positioned and arranged can be used as it is and be irradiated with laser light. This enables to improve productivity and downsize the equipment to be used. The following method is a specific example of the method using a device obtained by integrating a laser system and a connection device. First, the first main surface 50*a* of the solar cell element assembly 50 is caused to face upward, and the inner leads 17 are respectively disposed on the first output extraction electrodes 56*a* of the plurality of solar cell elements 201, to thereby connect the inner leads 17 by the predetermined method. Next, the second main surfaces 50*b* of the plurality of solar cell element assemblies 50 are caused to face upward, and the inner leads 17 connected to one solar cell element assembly 50 (50A) are disposed on the second output extraction electrode 57*a* of the other solar cell element assembly 50 (50B), which are connected to each other by a predetermined method. As a result, the assembly of strings 61 is formed. Then, the assembly of strings 61 can be irradiated with laser light while keeping the-above-mentioned arrangement. For example, the connection device that connects the inner leads 17 includes mounting means on which the solar cell element assembly 50 is mounted, such as a table, heating means that heats the inner leads 17, holding means that presses the inner leads 17 against the first output extraction electrode 56*a* or the second output extraction electrode 57*a* and holds those, and laser irradiation means that irradiates the solar cell element assembly 50 with laser light. The mounting means (table) may also serve as the transfer means that transfers the solar cell element assembly 50.

For example, the solar cell element assembly 50 may be irradiated with laser light after the solar cell element assembly 50 is cooled by, for example, spraying a gas onto the assembly of strings 61. This allows a crack to easily occur within the silicon substrate 51, which induces division. In particular, in a case where laser light is radiated immediately after connecting the inner leads 17, the temperature of the solar cell element assembly 50 has risen when the inner leads 17 were connected. However, the solar cell element assembly 50 is cooled with a gas as described above, whereby it is possible to radiate laser light immediately after the temperature of the solar cell element assembly 50 is lowered.

The laser system 70 may include an image recognition device. The laser system 70 can irradiate laser light after the image recognition device checks the irradiation position with laser light through image recognition of the shape of the electrode or the outer shape of the substrate in the solar cell element assembly 50. Therefore, even if a plurality of solar cell element assemblies 50 are connected to be out of alignment within the assembly of strings 61, laser light can be radiated within a desired boundary (imaginary dividing line) 62. This enables to improve a yield.

Additionally, the present invention is not limited to the embodiments described above, and numerous modifications and variations can be devised in the described aspects without departing from the scope of the invention. And also, it need not be said that the present invention includes various combinations of the embodiments described above.

DESCRIPTION OF SYMBOLS

101, 102, 103, 104, 105, 106: solar cell module
1*a*: short-length side
201, 202, 203, 204, 205: solar cell element
3: silicon substrate
4: light-receiving surface
5: non-light-receiving surface
6: opposite conductivity type layer
7: insulating layer
8*a*: first side surface
8*b*: second side surface
8*c*: third side surface
8*d*: fourth side surface
9: light-receiving-surface-side bus bar electrode (first bus bar electrode)
9*a*: first-side-surface-side electrode
9*b*: second-side-surface-side electrode
10: non-light-receiving-surface-side bus bar electrode (second bus bar electrode)
11: second current collector electrode
12: first current collector electrode (first finger electrode)
13: light-transmitting member
14*a*: light-receiving-surface-side sealing material
14*b*: non-light-receiving-surface-side sealing material
15: non-light-receiving-surface-side protective material
16: solar cell string
17: inner lead
19: bump
19*a*: first bump
19*b*: second bump
20: oxide film
21: BSF region
23: dividing groove
24: connecting member
25: auxiliary electrode
26: frame
27: output extraction electrode
27*a*: first output extraction electrode
27*b*: second output extraction electrode
28: connecting sheet
29: substrate sheet
30: circuit layer
30*a*: contact portion
31: protrusion
32: adhesive layer
33: bonding material
34: stress relaxing hole
50: parent substrate (solar cell element assembly)
50*a*: first main surface
50*b*: second main surface
51: silicon substrate
52: first semiconductor layer
53: second semiconductor layer
54: third semiconductor layer
54*a*: third region 54b: fourth region
55: anti-reflection layer
56: first electrode
56a: first output extraction electrode
56b: first current collector electrode
56c: first auxiliary electrode
56d: fifth region
56e: sixth region
57: second electrode
57a: second output extraction electrode
57b: second current collector electrode
57c: second auxiliary electrode
57d: first region
57e: second region
58: passivation layer
59: terminal box
60: output extraction interconnection
61: assembly of strings
62: boundary
81: installation surface
301: solar cell array

The invention claimed is:

1. A solar cell module, comprising:
at least one solar cell string including a plurality of solar cell elements, each including a first main surface being rectangular in shape and a first bus bar electrode extending along a long side direction on the first main surface, and an interconnection material that connects the solar cell elements adjacent to each other along the long side direction of the first main surface;
a light-transmitting member being rectangular in shape that is located to be substantially parallel to the first main surface so as to cover the at least one solar cell string; and
a sealing material located between the at least one solar cell string and the light-transmitting member, wherein
each of the plurality of solar cell elements includes a silicon substrate including the first main surface, a second main surface located on the back side of the first main surface, a first side surface connecting the first main surface and the second main surface, and a second side surface that is located on the back side of the first side surface and connects the first main surface and the second main surface, and
the first side surface and the second side surface are arranged along the long side direction of the first main surface, a silicon being exposed on the first side surface, the second side surface being covered with an insulating layer.

2. The solar cell module according to claim 1, wherein the second side surfaces of the plurality of solar cell elements in the at least one solar cell string are disposed to be flush with each other.

3. The solar cell module according to claim 1, wherein
the first main surface is a light-receiving surface,
a plurality of the first bus bar electrodes are provided on the first main surface,
the plurality of first bus bar electrodes include a first-side-surface-side electrode closest to the first side surface and a second-side-surface-side electrode closest to the second side surface, and
when viewed from the first main surface side, the distance between the first-side-surface-side electrode and the first side surface is larger than the distance between the second-side-surface-side electrode and the second side surface.

4. The solar cell module according to claim 1, wherein the solar cell element further includes at least one of a first bump portion located at an intersection portion of the first side surface and the first main surface and a second bump portion located at an intersection portion of the first side surface and the second main surface.

5. The solar cell module according to claim 4, wherein the solar cell element further includes at least one of a first oxide film located on the first bump portion and a second oxide film located on the second bump portion.

6. The solar cell module according to claim 5, wherein at least one of the first oxide film and the second oxide film is located to extend inwardly beyond the first bump portion or the second bump portion corresponding thereto on at least one of the first main surface and the second main surface corresponding thereto.

7. The solar cell module according to claim 1, wherein
the first main surface is a light-receiving surface,
each of the plurality of solar cell elements further includes a plurality of first finger electrodes that extend in a direction substantially perpendicular to the first bus bar electrode on the first main surface and are electrically connected to the first bus bar electrode,
a first end portion located on the first side surface side of both ends of the first finger electrode reaches the first side surface, and
a second end portion located on the second side surface side of the both ends of the first finger electrode is spaced from the second side surface.

8. The solar cell module according to claim 7, wherein the plurality of solar cell elements each further include, on the outer perimeter of the first main surface, a first auxiliary electrode that extends along the first side surface and is electrically connected to the first bus bar electrode through the first finger electrodes.

9. The solar cell module according to claim 1, wherein
the at least one solar cell string includes a plurality of solar cell strings,
the plurality of solar cell strings include a first solar cell string and a second solar cell string adjacent to the first solar cell string,
the first side surfaces of the plurality of solar cell elements in the first solar cell string are disposed to be located within a first surface,
the second side surfaces of the plurality of solar cell elements in the second solar cell string are disposed to be located in a second surface, and
the second surface is parallel to the first surface and is disposed to be opposed to the first surface.

10. The method of manufacturing solar cell module according to claim 1, comprising:
a first step of arranging a plurality of solar cell element assemblies including a plurality of the solar cell elements in one direction and connecting the solar cell elements corresponding to each other by a plurality of interconnection materials in the one direction to form an assembly of solar cell strings, the plurality of solar cell elements each including the silicon substrate that includes the first main surface and the second main surface on the side opposite to the first main surface; and
a second step of irradiating a boundary between the solar cell elements adjacent to each other in the assembly with laser light along the one direction from the second main surface side, and dividing the assembly into the individual solar cell elements by a thermal stress generated by the irradiation with the laser light, to thereby form a plurality of solar cell strings each including the plurality of solar cell elements connected in the one direction by the interconnection materials.

11. The method of manufacturing solar cell module according to claim 10, further comprising the step of forming a pn junction region on the first main surface of the silicon substrate before the first step.

12. The method of manufacturing solar cell module according to claim 10, further comprising the step of forming, on the second main surface in the solar cell element assembly, a second electrode including a first region and a second region disposed with a first distance from the first region in a direction perpendicular to the one direction before the second step,
 wherein in the second step, a portion in the first distance is irradiated with laser light, and the solar cell element assembly is divided into the individual solar cell elements at the portion in the first distance.

13. The method of manufacturing solar cell module according to claim 12, further comprising the step of forming, on the second main surface side in the second electrode of the solar cell element assembly, a semiconductor layer including a third region and a fourth region that are disposed correspondingly to the first region and the second region, respectively, before the second step.

14. The method of manufacturing solar cell module according to claim 12, further comprising the step of forming, on the first main surface in the solar cell element assembly, a first electrode including a fifth region and a sixth region disposed with a second distance from the fifth region in the direction perpendicular to the one direction before the second step,
 wherein in the second step, the solar cell element assembly is divided into the individual solar cell elements at the portion in the second distance.

15. The method of manufacturing solar cell module according to claim 14, wherein the first electrode and the second electrode are formed in the solar cell element assembly such that the ratio of the formation region of the second electrode in the second main surface is larger than the ratio of the formation region of the first electrode on the first main surface.

16. The method of manufacturing solar cell module according to claim 15, further comprising the step of curving the solar cell element assembly to be convexed toward the first main surface side before the second step,
 wherein in the second step, the solar cell element assembly is irradiated with the laser light while applying a stress in a direction in which the solar cell element assembly becomes flattened.

17. The method of manufacturing solar cell module according to claim 10, further comprising the step of forming, on the first main surface in the solar cell element assembly, a pair of auxiliary electrodes extending in parallel to the arrangement direction of the solar cell elements before the second step,
 wherein in the second step, the solar cell element assembly is divided into the individual solar cell elements between the pair of auxiliary electrodes.

18. The method of manufacturing solar cell module according to claim 10, wherein in the second step, the solar cell element assembly is irradiated with the laser light in an oxygen atmosphere.

19. The method of manufacturing solar cell module according to claim 10, further comprising a third step of transferring a first solar cell string among the plurality of solar cell strings,
 wherein in the third step, the first solar cell string is lifted up from a table on which the plurality of solar cell strings are mounted and is transferred while fixing the solar cell string other than the first solar cell string to the table.

* * * * *